United States Patent [19]

Cogan et al.

[11] Patent Number: 5,164,325
[45] Date of Patent: Nov. 17, 1992

[54] METHOD OF MAKING A VERTICAL CURRENT FLOW FIELD EFFECT TRANSISTOR

[75] Inventors: Adrian I. Cogan, San Jose; Richard A. Blanchard, Los Altos, both of Calif.

[73] Assignee: Siliconix Incorporated, Santa Clara, Calif.

[21] Appl. No.: 107,725

[22] Filed: Oct. 8, 1987

[51] Int. Cl.⁵ .............................. H01L 21/70
[52] U.S. Cl. ..................... 437/29; 437/203; 437/228; 437/235; 437/238; 437/979
[58] Field of Search ......... 437/38, 29, 40, 233, 437/235, 238, 228, 203, 979; 357/23.4; 156/643

[56] References Cited

U.S. PATENT DOCUMENTS

| | | | |
|---|---|---|---|
| 4,070,690 | 1/1978 | Wickstrom | 357/23.4 |
| 4,252,579 | 2/1981 | Ho et al. | 437/67 |
| 4,398,339 | 8/1983 | Blanchard et al. | 357/23.4 |
| 4,510,016 | 4/1985 | Chi et al. | 437/38 |
| 4,543,706 | 10/1985 | Bencuya et al. | 437/67 |
| 4,566,172 | 1/1986 | Bencuya et al. | 437/38 |
| 4,612,465 | 8/1986 | Schutten et al. | 357/23.4 |
| 4,700,460 | 10/1987 | Dolny et al. | 437/40 |
| 4,717,687 | 1/1988 | Verma | 437/985 |
| 4,767,722 | 8/1988 | Blanchard | 437/41 |
| 4,788,158 | 11/1988 | Chatterjee | 437/203 |
| 4,941,026 | 1/1990 | Temple | 357/23.4 |

FOREIGN PATENT DOCUMENTS

| | | | |
|---|---|---|---|
| 2803431 | 8/1979 | Fed. Rep. of Germany | 357/23.4 |
| 0065463 | 5/1980 | Japan | 357/23.4 |
| 0074960 | 1/1981 | Japan | |
| 2085656 | 4/1982 | United Kingdom | 357/23.4 |

OTHER PUBLICATIONS

C. P. Ho et al., "Si/SiO₂ Interface Oxidation Kinetics: A Physical Model for the Influence of High Substrate Doping Levels", J. Electrochem. Soc., Sep. 1979, pp. 1523-15-30.

Primary Examiner—Tom Thomas
Attorney, Agent, or Firm—Skjerven, Morrill, MacPherson, Franklin & Friel

[57] ABSTRACT

A transistor constructed in accordance with our invention includes an N+ substrate, an N− region formed on the N+ substrate, a P− body region formed on the N− region, and an N+ source region formed on the P− body region. A vertical groove extends through the N+, P− and N− regions, and an insulating layer is formed on the groove walls. A polysilicon gate is formed inside the groove. Of importance, the portion of the insulating layer between the polysilicon and the N+ region and the insulating layer between the polysilicon and the N+ substrate is thicker than the portion of the insulating layer between the polysilicon gate and the P− body region. Because of the enhanced thickness of the portions of the insulating layer between the gate and N+ substrate, the transistor constructed in accordance with our invention is less susceptible to premature field induced breakdown.

27 Claims, 24 Drawing Sheets

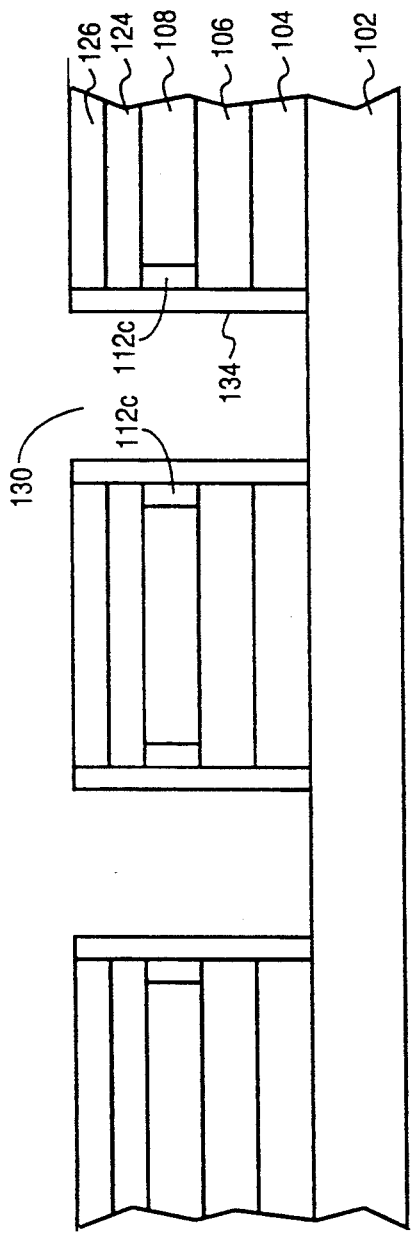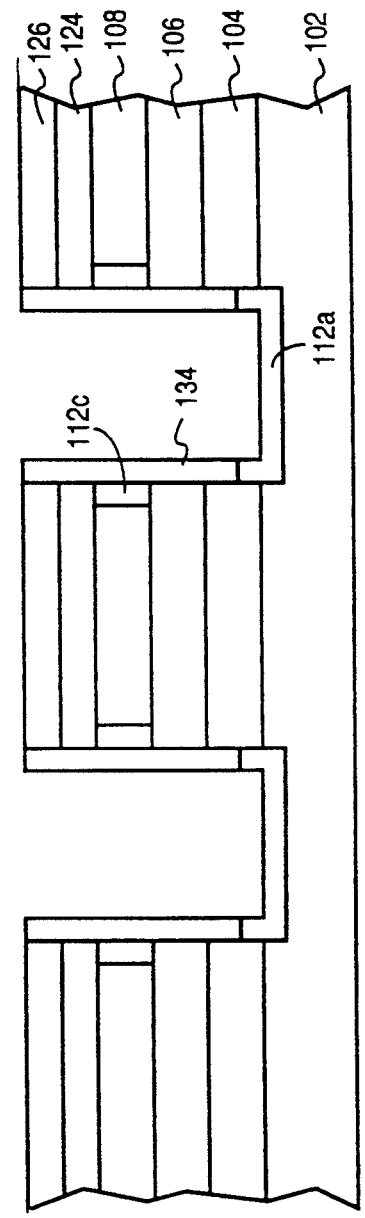

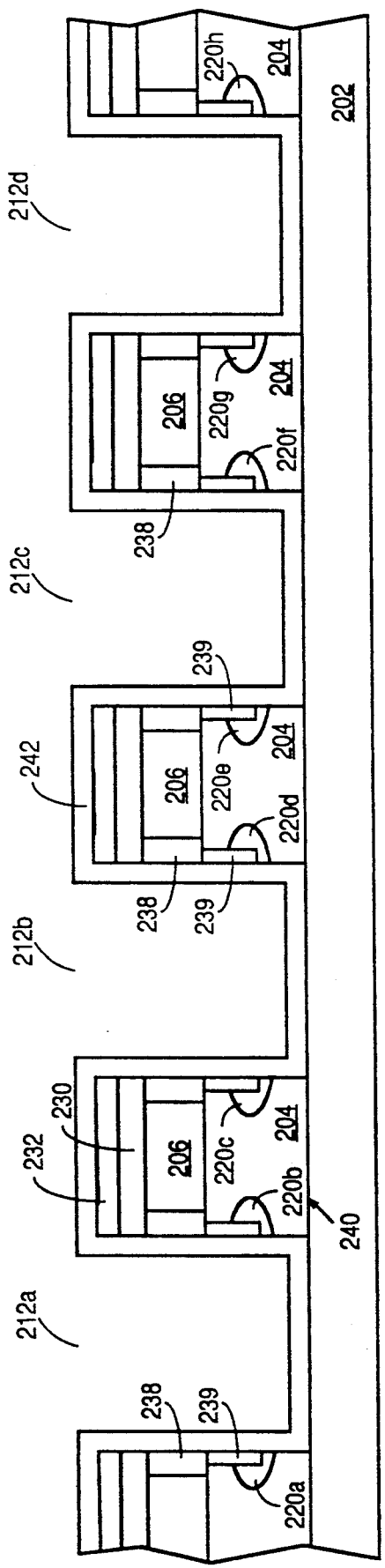
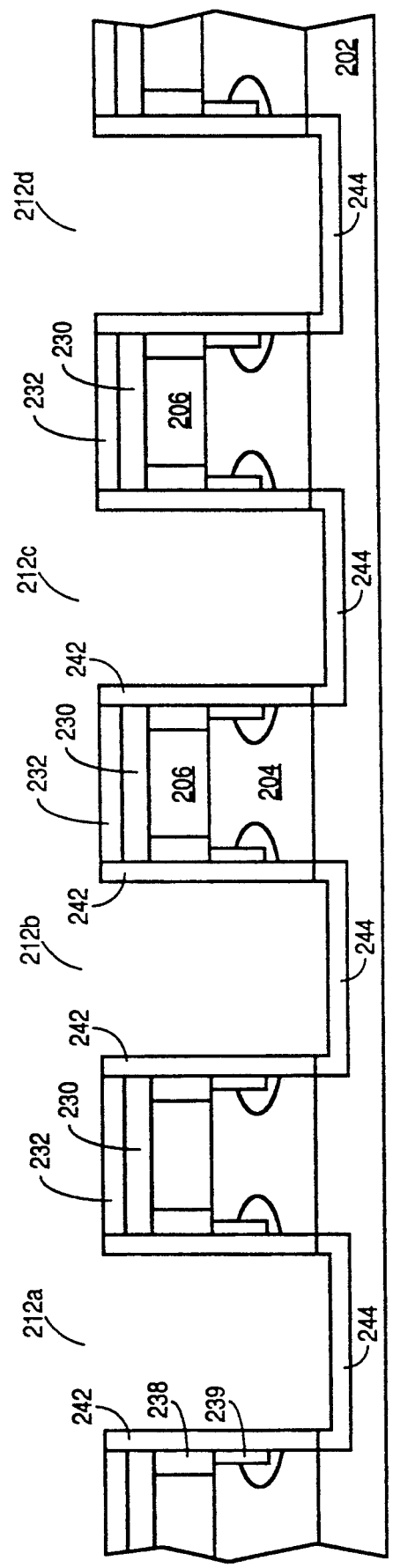
FIG. 6d
FIG. 6e

METHOD OF MAKING A VERTICAL CURRENT FLOW FIELD EFFECT TRANSISTOR

This application is related to our copending U.S. patent application Ser. No. 95,481, entitled "Dense Vertical J-Mos Transistor", filed Sep. 10, 1987, now U.S. Pat. No. 4,791,462, issued Dec. 13, 1988 incorporated herein by reference.

BACKGROUND OF THE INVENTION

This invention relates to MOS transistors and more specifically to vertical current flow MOSFETs.

FIG. 1a illustrates a vertical MOSFET 10 constructed in accordance with the prior art. MOSFET 10 includes an N+ source region 12, a P− body region 14 electrically coupled to source region 12, and an N+ drain region 16. Between P− body region 14 and N+ drain region 16 is an N− region 18 which enhances the junction breakdown voltage between the N+ drain 16 and P− body region 14. (The breakdown voltage of a PN junction between a P− region such as region 14 and an N− region such as region 18 is greater than the breakdown voltage of a junction between a P− region and an N+ region.)

A trench 19 is etched through regions 12, 14, and 18. A layer of gate insulation 20 lines the interior of trench 19 and a polysilicon gate 22 is formed on the gate insulation. When a positive voltage is applied to gate 22 relative to source region 12, transistor 10 turns on, thereby permitting current to flow between drain 16 and source 12, but when zero volts is applied to gate 22 relative to source 12, transistor 10 turns off.

When gate 22 is held at zero volts relative to source 12 and a large voltage is applied to drain 16 relative to source 12, the junction between P− region 14 and N− region 18 is reverse biased. If a sufficiently large voltage is applied to N+ drain 16, the depletion region which normally forms between regions 14 and 18 extends into N+ region 16. When that happens, because of the difference in voltage applied to gate 22 and N+ drain 16, an electric field is generated which causes the junction breakdown voltage between P− body region 14 and N+ drain 16 to decrease. The decrease in breakdown voltage of transistor 10 caused by the above-mentioned electric field is known as premature field-induced breakdown, and is an undesirable phenomenon. (Premature field-induced breakdown is discussed by Wu-Shiung Feng et al. in "MOSFET Drain Breakdown Voltage," published in IEEE Electron Device Letters, Vol. EDL-7, No. 7, July 1986, page 449-450, incorporated herein by reference.)

FIG. 1b illustrates a second transistor 24 constructed in accordance with the prior art. In FIG. 1b, trench 19 only extends partway through N− region 18. Thus, if the depletion region which normally forms between P− region 14 and N− region 18 extends to N+ region 16, the point where the depletion region reaches N+ region 16 is a greater distance from gate 22 than it would be in prior art transistor 10 of FIG. 1a. Thus, the strength of the electric field generated by the voltage applied to gate 22 would be attenuated, and the tendency of transistor 24 to exhibit premature field induced breakdown would be less than that of transistor 10. Unfortunately, in transistor 24, current flowing from drain 16 to source 12 must flow through a region indicated by arrows 26 and 28 which is N− material, and thus adds to the source drain series resistance exhibited by transistor 24. This extra series resistance represents a major disadvantage to transistor 24.

For transistors 10 and 24, the breakdown voltage of the transistor is increased by increasing the thickness of gate insulation 20. Unfortunately, increasing the thickness of insulation 20 increases the transistor threshold voltage and transistor on-resistance—an undesirable result.

SUMMARY

An MOS transistor constructed in accordance with our invention includes a thin insulation region which separates the gate from the active area of the channel, but also includes a thick insulation region which insulates the gate from the source and drain so as to mitigate the problem of premature field-induced breakdown.

In one embodiment of our invention, an N channel transistor includes an N+ substrate which serves as a transistor drain, an N− region formed on the N+ substrate, a P− body region formed above the N− region, and an N+ source formed above the P− body region. (Although an N channel MOS transistor is described herein, in another embodiment of our invention, a P channel transistor is formed by reversing the conductivity types of the various transistor regions.) A trench extends through the N+ source, the P− body region, and the N− region. A layer of gate insulation and a layer of gate material are formed in the trench. In accordance with one feature of our invention, the portion of the gate insulation separating the gate from the N+ source is thicker than the gate insulation separating the gate from the P− body region. In addition, the portion of the gate insulation material separating the gate from the N− region and the N+ drain region is thicker than the portion of the gate insulation separating the gate from the P− region. Because of this, the gate is further from the N+ drain than in prior art transistor 10 discussed above, and the electric field in the N+ drain caused by the voltage applied to the gate is attenuated. Thus, the voltage applied to the gate is less likely to induce an electric field which will cause premature field-induced breakdown.

Of importance, the trench in which the gate is formed extends through the N− region, and when the transistor is on, the voltage applied to the gate enhances the N type carrier concentration in the portion of the N− region near the gate insulation. This enhanced carrier concentration causes the transistor of the present invention to exhibit less drain source series resistance than prior art transistor 24.

A process for forming a transistor in accordance with our invention begins with the step of forming an N− region on an N+ substrate, forming a P− body region on the N− region, and forming an N+ source region on the P− body region. (The N+ substrate serves as the transistor drain.) A trench is then etched through the N+ source region and a first insulating layer (typically SiO₂) is formed on the sidewalls of the trench. Thereafter, the trench is extended through the P− and N− regions and a layer of a material such as Si₃N₄ is formed on the sidewalls of the trench. The trench is then extended through a portion of the N+ substrate and a second insulating layer (also typically SiO₂) is formed at the bottom of the trench. Thereafter, the Si₃N₄ layer is removed, thereby exposing a portion of the P− body region and the N− region. A third insulating layer is then formed on the exposed portions of the P− body region and the N− region. A layer of conductive material, which serves as the transistor gate, is then deposited in the trench.

Of importance, the third insulating layer is thinner than the first and second insulating layers. The third insulating layer insulates the conductive gate from the P− body region. The first and second insulating layers both insulate the gate from the source and drain region and also provide a means for separating the gate from the various depletion regions of the transistor so that any electric field caused by the gate will not significantly reduce the breakdown voltage of the transistor.

In another embodiment, portions of the gate insulation of a vertical JMOS transistor have enhanced thickness to avoid the problem of premature field-induced breakdown. A JMOS transistor in accordance with this embodiment includes an N+ substrate, an N− epitaxial layer formed on the N+ substrate, and an N+ region formed at the surface of the epitaxial layer. The N+ substrate serves the transistor drain, the N− epitaxial layer serves as the transistor channel, and the N+ region serves as the source. A plurality of grooves are etched to extend through the N+ region and the epitaxial layer, and an insulating layer (typically silicon dioxide) is formed on the walls of the grooves. Each groove is then filled with conductive material which functions as the transistor gate. In one embodiment, the conductive material is doped polycrystalline silicon.

When a low voltage is applied to the gate, the concentration of current carriers (electrons for an N channel transistor) in the channel region is reduced, thereby causing the JMOS transistor to turn off. When a low voltage is not applied to the gate, current is permitted to flow between the source and drain, and the transistor remains on.

A P+ region is formed outside the groove wall within the N− epitaxial layer. The P+ region is connected to a lead so that a voltage can be externally applied to the P+ region. When a negative voltage is applied to the transistor gate, thereby forming a depletion region in the channel region, an appropriate voltage can be applied to the P+ region to remove any holes which may accumulate adjacent to the insulating layer. This prevents formation of a P type inversion region in the transistor channel which could otherwise conduct an undesired parasitic current.

In accordance with one novel feature of our invention, the portion of the gate insulating layer adjacent to the N+ region and N+ substrate is thicker than the portion of the gate insulating layer adjacent the N− epitaxial layer. Thus, the capacitance between the gate and the source and drain regions is minimized without adversely impacting the transconductance of the transistor.

Another advantage to the thick insulating layer in the JMOS transistor is the prevention of premature field induced breakdown. In a JMOS transistor, when a low voltage is applied to the gate relative to the source, a deep depletion region forms in the channel region. The junction between the N+ drain region and the deep depletion region can break down if the voltage applied across the source and drain is sufficiently large. The breakdown voltage of this junction is reduced by the presence of a large electric field (caused by the low voltage applied to the gate) at the junction between the depletion region and the drain. By forming a thick insulation layer separating the gate from the drain, the electric field at this junction is attenuated, thereby reducing the tendency of the JMOS transistor to exhibit premature field induced breakdown.

These and other advantages of the present invention are discussed in greater detail below.

BRIEF DESCRIPTION OF THE DRAWINGS

FIGS. 4a to 4k illustrate the vertical MOS transistor during a manufacturing process in accordance with the first embodiment of the present invention.

FIGS. 6a to 6j illustrate in cross section a first portion of the JMOS transistor of FIG. 5 during a manufacturing process in accordance with the second embodiment of our invention;

DETAILED DESCRIPTION

Figure 1A:
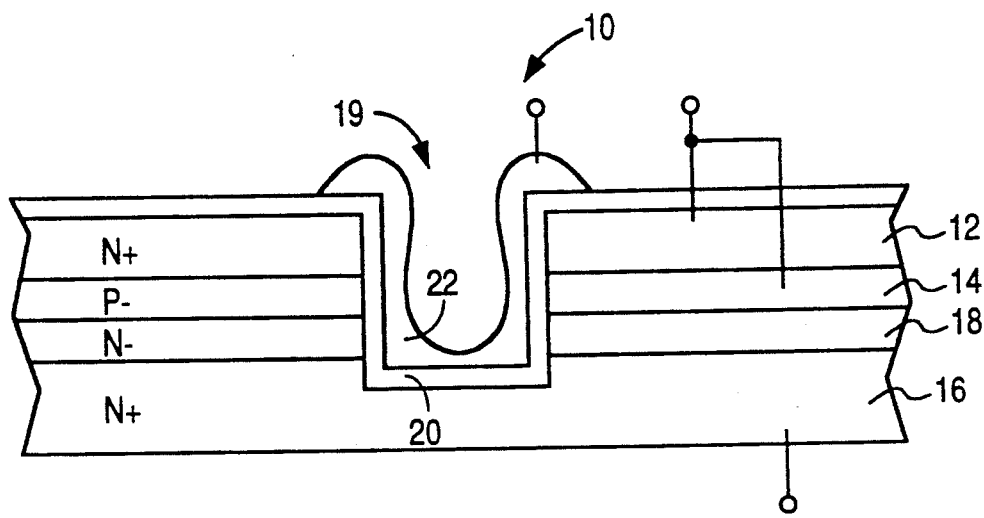
FIGS. 1a and 1b illustrate in cross section a vertical MOS transistor constructed in accordance with the prior art.
Figure 1B:
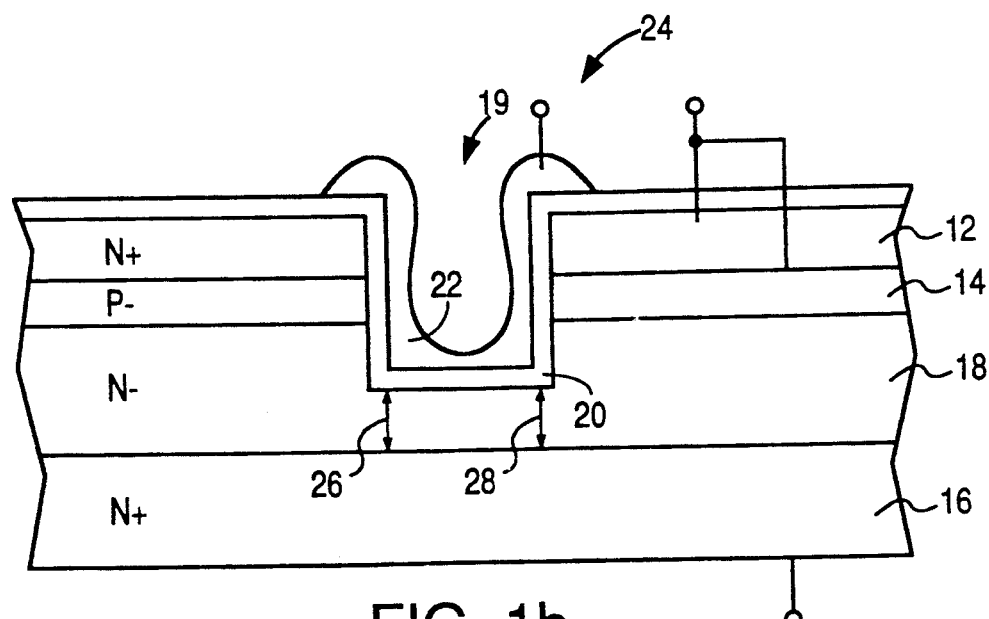
Figure 2:
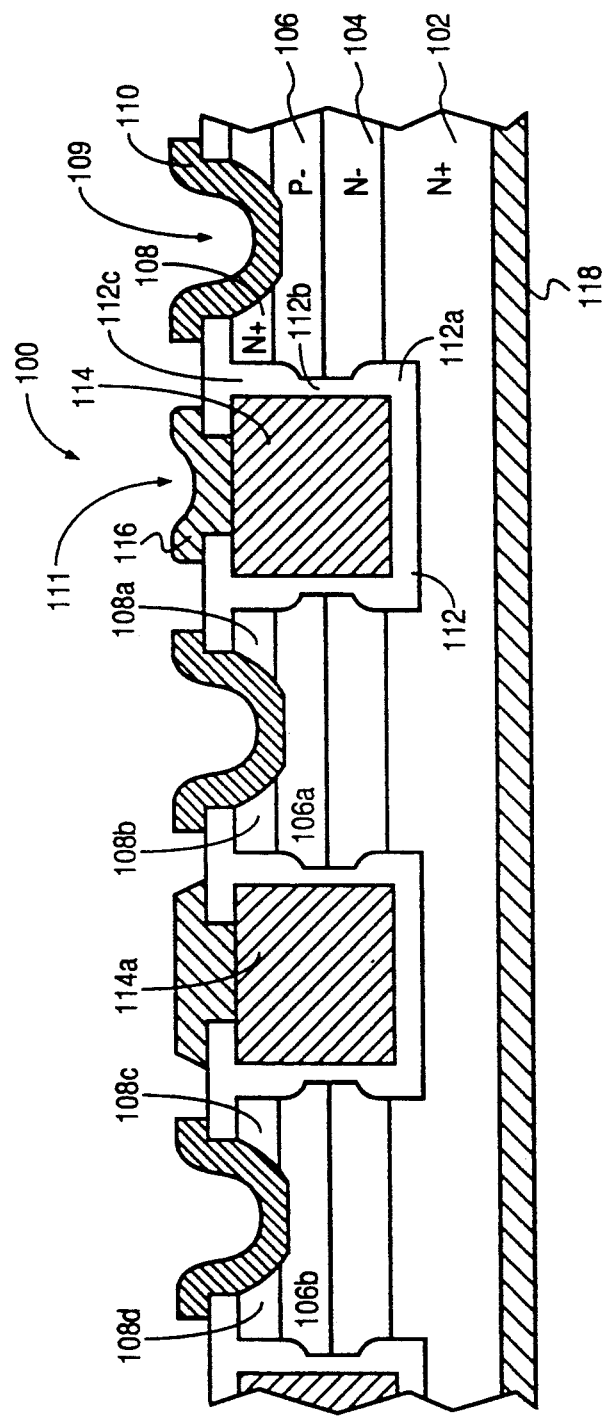
FIG. 2 illustrates a vertical MOS transistor constructed in accordance with a first embodiment of our invention.

FIG. 2 illustrates a vertical N channel transistor 100 constructed in accordance of one embodiment of our invention. Referring to FIG. 2, it is seen that transistor 100 includes an N+ substrate 102 which serves as a drain region, an N− region 104, a P− body region 106, and an N+ source region 108. N− region 104 enhances the breakdown voltage of transistor 100 in a manner similar to N− region 18 of transistors 10 and 24.

A groove 109 extends through N+ source region 108 and a portion of P− body region 106 to permit source and body contact metallization 110 to electrically contact both P− body region 106 and N+ source region 108. A second trench 111 extends through N+ source region 108, P− body region 106, N− region 104, and a portion of N+ substrate 102, and the interior of second trench 111 is lined with gate insulation layer 112. The remainder of trench 111 is filled with a polysilicon gate 114 which is electrically contacted by gate contact metallization 116. Also illustrated in FIG. 2 is bottom side drain contact metallization 118.

Also illustrated in FIG. 2 is a second gate 114a. Although gates 114 and 114a are illustrated as two separate structures, gate 114 and 114a are typically either a single gate joined outside of the cross section of FIG. 2, or are electrically connected together outside the cross section of FIG. 2. Similarly, N+ regions 108a to 108d are either contiguous with N+ source region 108 outside the cross section of FIG. 2, or are electrically connected to region 108. P− body regions 106a and 106b are similarly connected to region 106. The portion of transistor 100 illustrated in FIG. 2 is typically a small portion of a much larger transistor. Thus, transistor 100 includes a number of structures identical to those illustrated in FIG. 2.

As can be seen, gate insulation layer 112 includes a first thick region 112a (e.g. 50 nm to 500 nm thick) for separating polysilicon gate 114 from N+ substrate 102, a thin region 112b (e.g. 10 nm to 250 nm thick) for separating polysilicon gate 114 from the active regions of P− body region 106 and N− region 104, and a second thick region 112c (e.g. 50 nm to 800 nm thick) for separating polysilicon gate 114 from N+ source region 108. Of importance, because of the enhanced thickness of portion 112a of gate insulation layer 112, the electric field caused by the voltage applied to gate 114 is attenuated at N+ drain region 102. Thus, this electric field is less likely to cause premature field-induced breakdown of the junction between regions 106 and 102 than prior art transistors 10 and 24 described above. The enhanced thickness of portions 112a and 112c of insulation layer 112 also reduce the gate-drain and gate-source capacitance, respectively. In addition, the enhanced thickness of portion 112c causes the electrical characteristics of transistor 100 when substrate 102 serves as the transistor drain to be similar to the electrical characteristics of transistor 100 when operated in an inverse mode such that N+ region 108 serves as the transistor drain.

Portion 112c typically extends from 0 to 600 nm below the interface between regions 106 and 108. Region 112a typically extends 0 to 800 nm above the border between substrate 102 and N− region 104.

It is noted that when transistor 100 is on, current flows from drain 102, through regions 104 and 106, to source 108. Although current must still flow through N− region 104 when transistor 100 is on, and N− semiconductor material is normally resistive, when transistor 100 is on, a high voltage is applied to gate 114 which creates a region of enhanced carrier concentration in N− region 104 to thereby reduce the series source drain resistance of transistor 100.

Although FIG. 2 illustrates metallization 116 used to contact gate 114 as being in the same cross section plane as contact metallization 110, those skilled in the art will appreciate that one can also form the transistor of the present invention without forming the gate contacts in the same plane as source/body region contact 110.

Figure 3A:
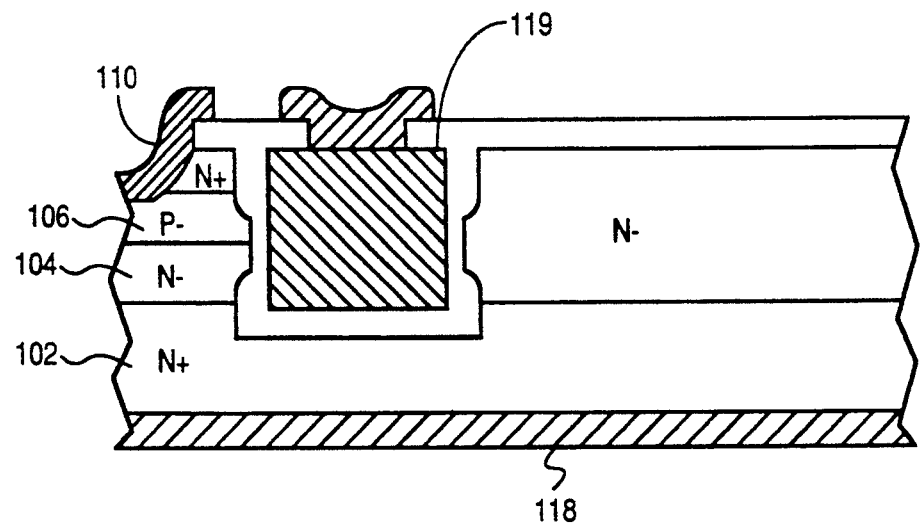
FIGS. 3a and 3b illustrate alternative edge structures of the vertical MOS transistor of FIG. 2.
Figure 3B:
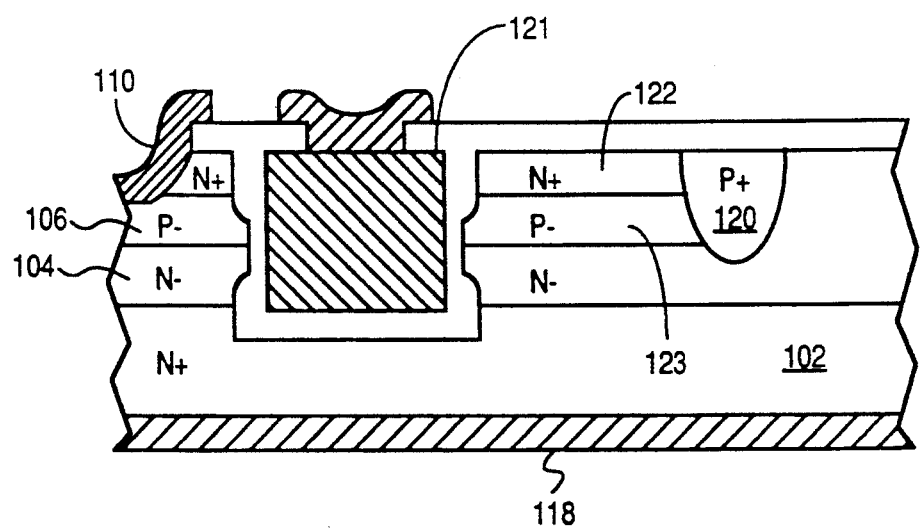

FIGS. 3a and 3b illustrate alternative edge structures for transistor 100. Thus, in one embodiment, transistor 100 illustrated in FIG. 2 extends from the left side of the edge structure illustrated in FIG. 3a. In the embodiment of FIG. 3a, transistor 100 simply terminates at a gate structure 119. (Gate structure 119 is typically connected to the other gate structures of the transistor and completely encircles the transistor.) P− body region 106 and N+ source region 108 are not extended past polysilicon gate 119.

In another embodiment, transistor 100 of FIG. 2 extends from the left side of the edge structure of FIG. 3b. In the FIG. 3b embodiment, the P− body region and N+ source region are extended past the last polysilicon gate structure 121 in the transistor. (In FIG. 3b, the N+ and P− regions to the right of gate 121 are not electrically contacted or electrically connected to the portion of N+ or P− regions to the left of gate 121.) Also illustrated in FIG. 3b is a P+ field limiting ring 120. P+ ring 120 is an optional structure which completely encircles the transistor, and is also typically not electrically contacted. Field limiting ring 120 is used to increase the radius of curvature of the depletion region between P− region 106 and N− region 104 in the border region of the transistor to thereby increase the breakdown voltage of the transistor.

Figure 4A:
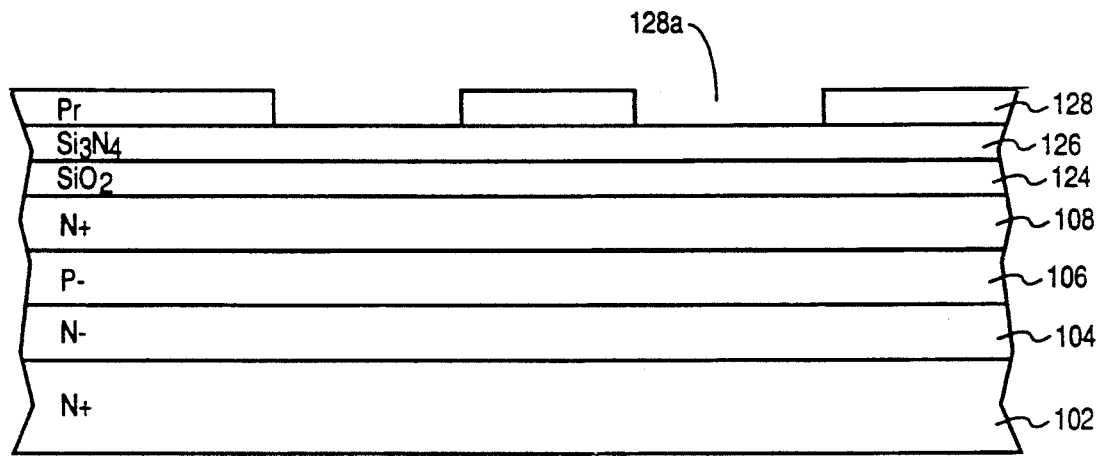

A process for forming an MOS transistor in accordance with our invention begins with the step of forming N− region 104, P− region 106, and N+ region 108 on an N+ substrate 102 (FIG. 4a). In one embodiment, N+ substrate 102 comprises silicon having a [100] crystal orientation and a dopant concentration of about $10^{19}$/cc. N− region 104 is also silicon having a dopant concentration of about $10^{14}$ to $10^{17}$/cc and a thickness of 1000 to 5000 nm. P− region 106 has a dopant concentration of about $10^{15}$ to $10^{17}$/cc and a thickness of 1000 to 2000 nm and N+ region 108 has a dopant concentration of about $10^{19}$ to $10^{20}$/cc and a thickness of 500 to 1000 nm. As mentioned above, portions of N+ region 108 serve as the source of the transistor, portions of P− region 106 serve as the body region, and N− region 104 and N+ substrate 102 serve as the drain.

In one embodiment of the invention, N− region 104 is an epitaxial layer and P− region 106 and N+ region 108 are formed by diffusion or implantation of suitable impurities into N− epitaxial layer 104. In another embodiment, regions 104, 106, and 108 are all formed by epitaxial deposition. In another embodiment, regions 104, 106, and 108 are all formed by diffusion or implantation of a suitable impurity into N+ substrate 102.

A $SiO_2$ layer 124 is then thermally grown on N+ region 108 to a thickness of approximately 300 to 1500 nm, and an $Si_3N_4$ layer 126 is formed on $SiO_2$ layer 124, e.g. to a thickness of 50 nm to 400 nm by a chemical vapor deposition process. Thereafter, a photoresist layer 128 is formed on $Si_3N_4$ layer 126 and then patterned, using conventional techniques, to form a window region 128, thereby exposing a portion of underlying $Si_3N_4$ layer 126. Window region 128 defines the lateral extent of a subsequently formed trench where a silicon gate is to be formed.

Figure 4B:
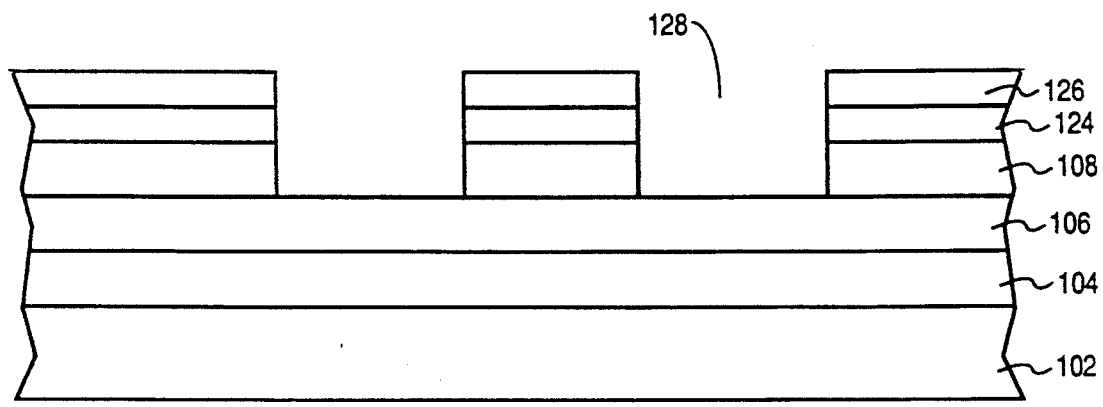

Referring to FIG. 4b, the exposed portions of $Si_3N_4$ layer 126 are then removed, along with the underlying portion of $SiO_2$ layer 124, and N+ region 108, thereby forming a trench 130. In one embodiment, layers 126, 124 and 108 are etched using a dry etching process such as plasma etching, reactive ion etching or ion milling. The depth of resulting trench 130 can be controlled either by careful timing of this etching process or by using an etching process which preferentially etches N+ region 108 much more rapidly than P− region 106. (During this step, other trenches are formed elsewhere in the wafer where transistor structures are to be formed. The discussion herein refers only to one part of the transistor, it being understood that similar structures are concurrently formed elsewhere on the wafer.) Photoresist layer 128 is then removed.

Figure 4C:
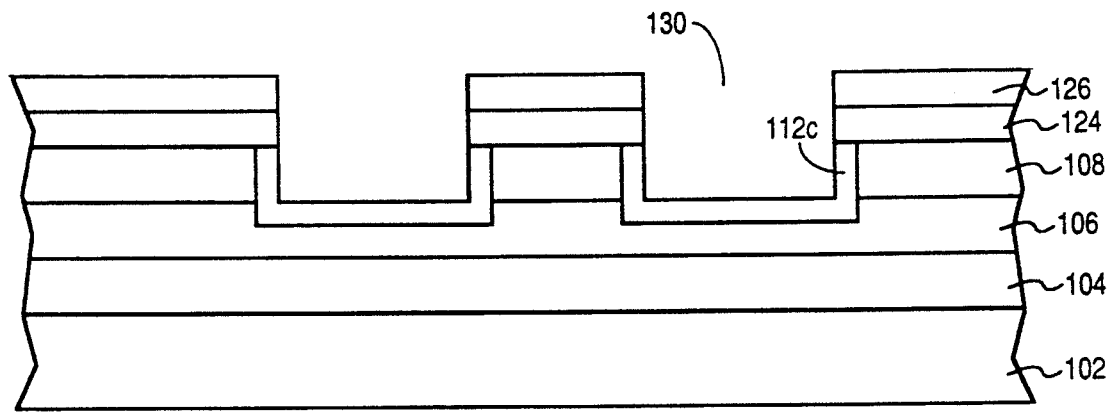

$SiO_2$ layer 112c (FIG. 4c) is then thermally grown on the walls of trench 130, e.g. to a thickness of about 50 to 600 nm. As will be described in greater detail below, the portion of $SiO_2$ 112c on the vertical trench wall insulates N+ region 108 from a subsequently formed polysilicon gate structure. The portion of $SiO_2$ layer 112c on the bottom of trench 130 is then removed, e.g. using a dry etching process which etches preferentially in the vertical direction, i.e. a reactive ion etching, plasma etching, or ion milling process. This etching process can be performed without the need of an additional photolithographic mask because $Si_3N_4$ layer 126 protects the underlying portion of $SiO_2$ layer 124. In addition, because the etching process preferentially etches $SiO_2$ in the vertical direction, it is unnecessary to protect the portions of SiO$_2$ layer 112c along the vertical walls trench 130.

Figure 4D:
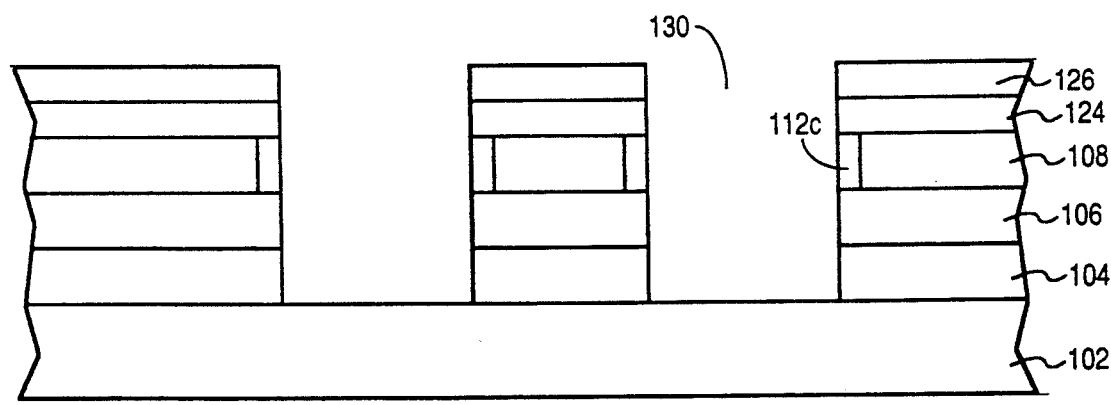

Referring to FIG. 4d, trench 130 is extended through P− layer 106 and N− layer 104. This etching step can also be accomplished using the above-mentioned plasma etching, reactive ion, ion milling or other dry etching process. The depth to which trench 130 is extended can be controlled by either carefully controlling the timing of this etching step or by using an etching process which preferentially attacks P− region 106 and N− region 104 much more rapidly than N+ substrate 102.

An Si$_3$N$_4$ layer 134 (FIG. 4e) is then deposited on the wafer, e.g. to a thickness of 50 to 100 nm using a conventional chemical vapor deposition technique. Thereafter, the wafer is subjected to a vertical dry etching process to remove the portion of Si$_3$N$_4$ layer 134 on the bottom of trench 130 and the top surface of the wafer. This etching step is carefully timed to avoid removing Si$_3$N$_4$ layer 126. Of importance, a portion of Si$_3$N$_4$ layer 134 remains on the vertical walls of trench 130 at the conclusion of this step.

The wafer is subjected to another silicon etching step in which trench 130 is extended by a distance of 100 to 700 nm through a portion of N+ substrate 102 (FIG. 4f). SiO$_2$ layer 112a is then thermally grown at the bottom of trench 130, e.g., to a thickness of about 50 to 500 nm. Of importance, Si$_3$N$_4$ layer 134 prevents SiO$_2$ from forming on the sidewalls of P− region 106 during this step, and also prevents the thickness of SiO$_2$ layer 112c from increasing.

Figure 4G:
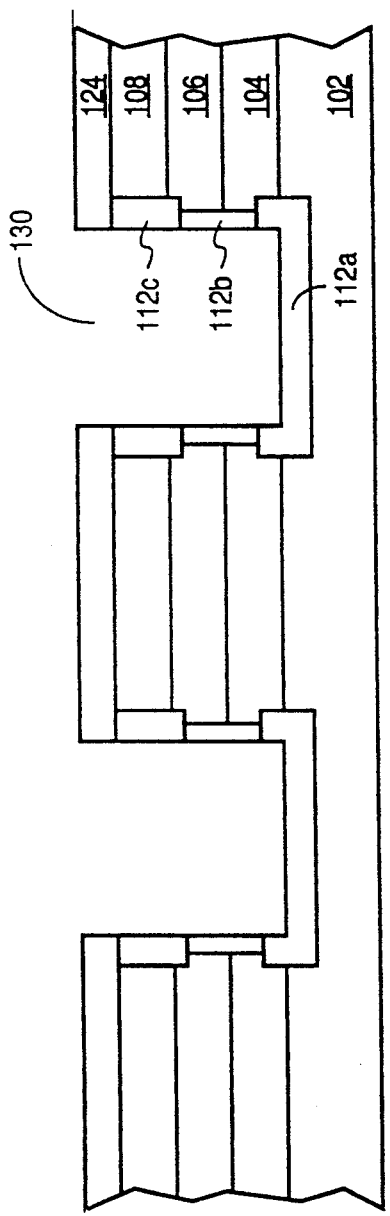

Referring to FIG. 4g, Si$_3$N$_4$ layers 126 and 134 are removed, for example, by placing the wafer in a phosphoric acid etching solution. The wafer is then removed from the etching solution and subjected to another thermal oxidation step to form SiO$_2$ sidewalls 112b, e.g., to a thickness of 10 to 250 nm. SiO$_2$ layer 112b insulates P− region 106 and N− region 104 from a subsequently formed polysilicon gate. Of importance, the thicknesses of SiO$_2$ layers 124, 112a and 112c also increase during this step, to thicknesses of 0.2 to 1.0 μm, 50 to 500 nm, and 50 to 800 nm, respectively.

Figure 4H:
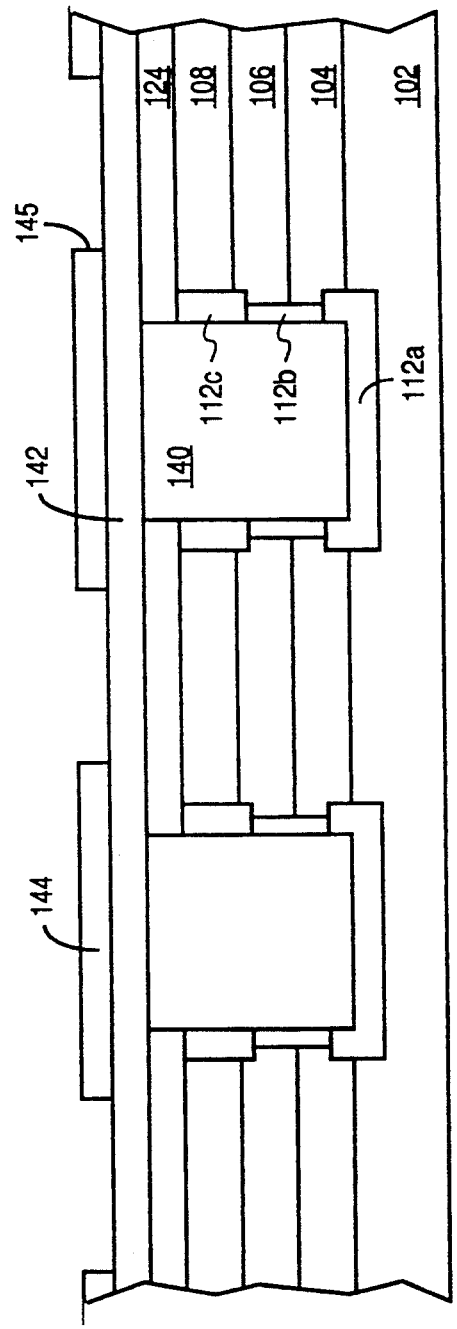

Referring to FIG. 4h, the wafer is covered with a polysilicon layer 140 by chemical vapor deposition. The polysilicon layer 140 is subjected to a planarizing process, such that at the end of the etching process, polysilicon layer 140 is removed from the surface of the wafer except for the portion of polysilicon in trench 130. Thereafter, the wafer is covered with another SiO$_2$ layer 142, formed either by thermal oxidation or chemical vapor deposition. In one embodiment, SiO$_2$ layer 142 is 0.1 to 1.0 μm thick. SiO$_2$ layer 142 is then covered with a photoresist layer 144 which is patterned in a conventional manner to form a window region 145 which defines where P− body region 106 and N+ source 108 are to be exposed and subsequently electrically contacted.

Figure 4I:
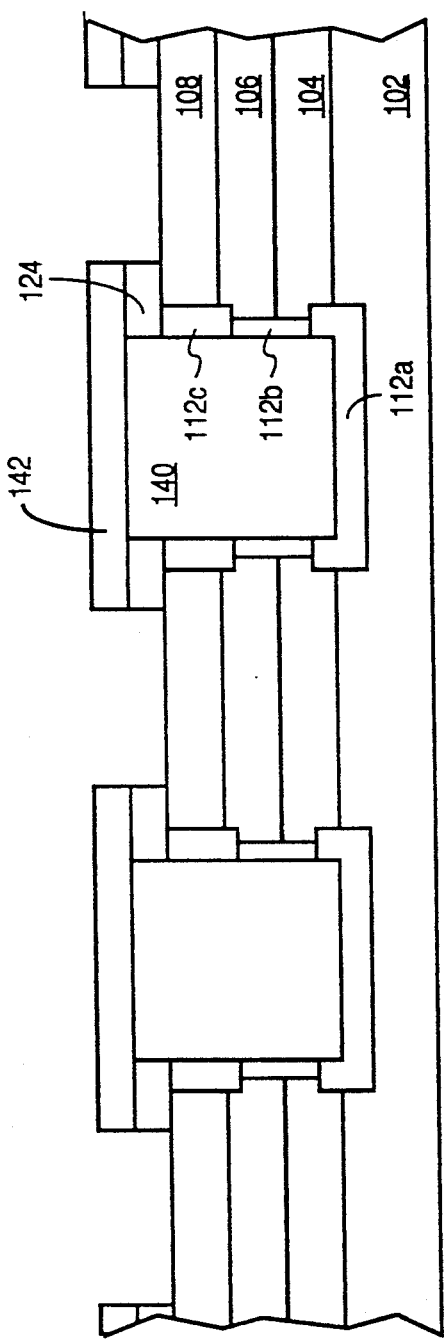

Referring to FIG. 4i, the portions of SiO$_2$ layers 142 and 126 within window region 145 are then etched away, e.g. with a dry etching process or an HF solution, thereby exposing portions of N+ source region 108. Photoresist layer 144 is then removed.

Figure 4J:
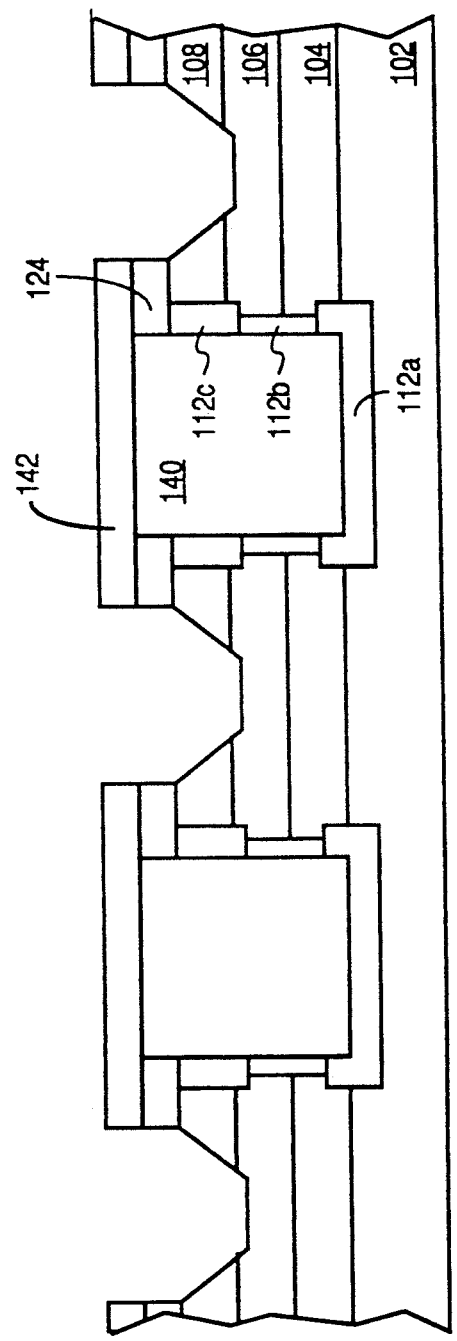

The wafer is then subjected to a silicon etching process to remove portions of N+ region 108 and P− regions 106 (FIG. 4j). This etching step can be performed using either a dry etchant or a wet etchant such as a KOH solution. Of importance, the remaining portions of SiO$_2$ layers 142 and 124 serve as a mask during this silicon etching step.

Figure 4K:
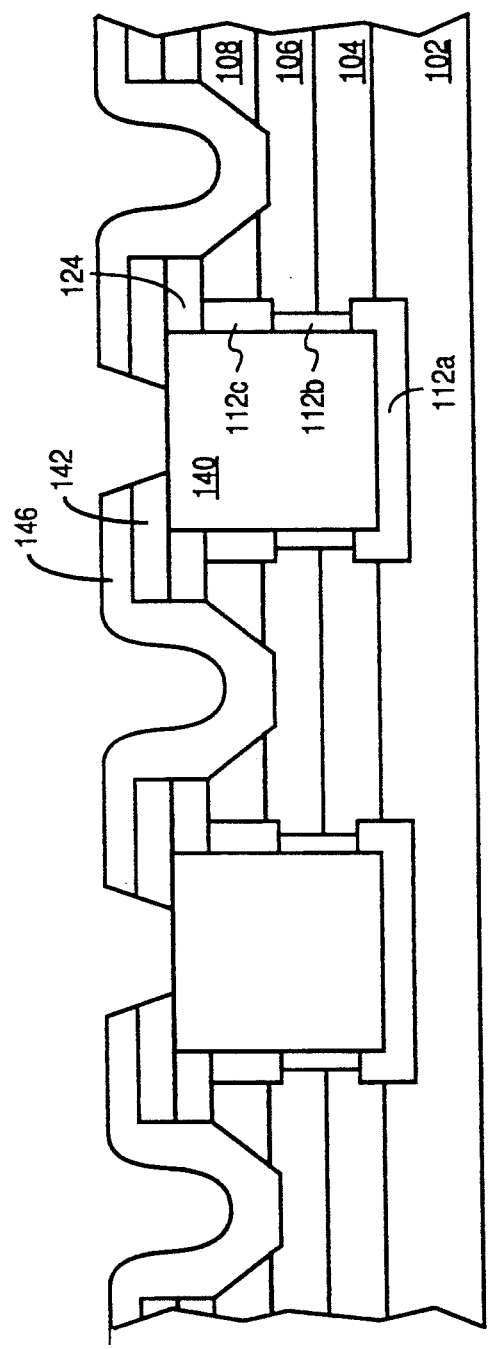

The wafer is then covered with another photoresist layer 146 which is patterned to define a gate contact area, and the portion of SiO$_2$ layer 142 within the gate contact area is etched away, e.g., with an HF solution (FIG. 4k). Photoresist layer 146 is then removed.

The wafer is then covered with a metal layer 146 (typically aluminum or an aluminum alloy) which is then patterned using conventional techniques, e.g. sputtering or evaporation, thereby forming gate contact metallization 116 and source and body contact metallization 110. Drain contact metallization 118 is then formed on the bottom side of the wafer. The resulting structure is illustrated in FIG. 2.

Figure 5:
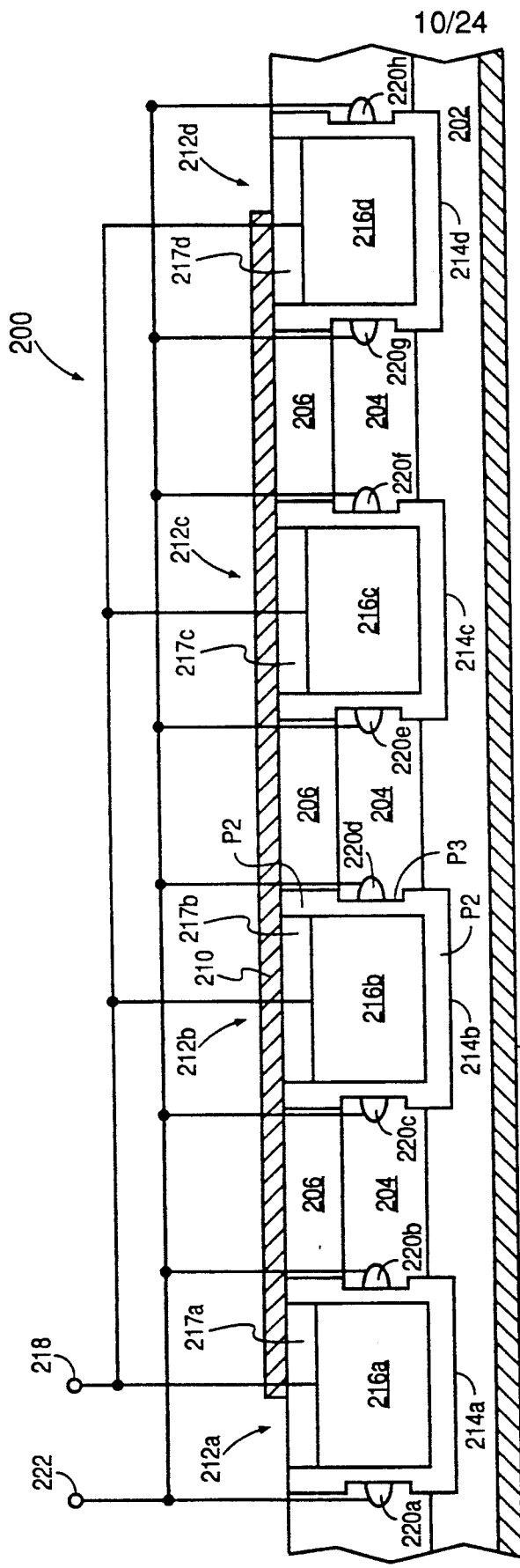
FIG. 5 illustrates in cross section a vertical JMOS transistor constructed in accordance with a second embodiment of our invention.

The present invention can also be used in conjunction with a JMOS transistor, e.g. transistor 200 as illustrated in FIG. 5. (An example of a prior art JMOS transistor is discussed by MacIver et al. in the article entitled "j-MOS: A Versatile Power Field-Effect Transistor", published in IEEE Electron Device Letters in May, 1984, incorporated herein by reference.)

Referring to FIG. 5, transistor 200 includes an N+ substrate 202 which serves as a drain, a plurality of N− regions 204 which serve as a channel, and a plurality of N+ regions 206 which serve as the transistor source. Although N+ source regions 206 are drawn as a plurality of separate regions, in one embodiment, N+ regions 206 form a single contiguous region joined outside the cross section plane of FIG. 5. (In such an embodiment, channel regions 204 also form a single contiguous region.) A metal layer 210 formed on source regions 206 serves as a common source contact, while a metal layer 208 formed on the bottom of substrate 202 serves as a drain contact. A plurality of grooves 212a to 212d are etched to extend through N+ source regions 206, N− channel regions 204 and a portion of substrate 202. Formed in grooves 212a to 212d are SiO$_2$ layers 214a to 214d respectively, which insulate heavily doped polysilicon gates 216a to 216d from the surrounding semiconductor material. In addition, gates 216a to 216d are insulated from source contact 210 by SiO$_2$ layers 217a to 217d, respectively.

Gates 216a to 216d are connected, in a manner described below, to a gate contact 218. Although gates 216a to 216d are illustrated as separate structures, in one embodiment of our invention, gates 216a to 216d are a single contiguous region joined outside the cross section of the plane of FIG. 5. However, in another embodiment, gates 216a to 216d are merely electrically connected together.

When an appropriate low voltage is applied to gates 216a to 216d relative to source regions 206, current carriers (electrons) are removed from a portion of the channel region 204, thereby restricting current flow between source 206 and drain 202. If the voltage applied to gates 216a to 216d is sufficiently low, this depletion region becomes large enough to prevent current flow between the source and drain.

In contrast, when it is desired to permit current to flow between source 206 and drain 202, gate 218 is held at a voltage equal to the source voltage so that a depletion region does not form in channel regions 204, thereby permitting current to flow between sources 106 and drain 102.

In one embodiment, the drain-source resistance of transistor 200 can be reduced by applying a high voltage to gates 216a to 216d. This is accomplished because a high voltage at gates 216a to 216d causes the accumulation of current carriers (electrons) in the transistor channel regions.

Also illustrated in FIG. 5 are P+ regions 220a to 220h. As described in greater detail below, P+ regions 220a to 220h are electrically coupled to a lead 222. Regions 220a to 220h are used to sink any holes present near SiO₂ layer 214a to 214d to thereby present holes from conducting parasitic current between source 206 and drain 202 during device operation. If P+ regions 220a to 220h were not present, the application of a low voltage to gates 216a to 216d would cause an accumulation of holes near gates 216a to 216d. If a sufficiently low voltage were applied to gates 216a to 216d, a P type inversion layer would form, and this P type inversion layer could conduct a parasitic current between source 206 and drain 202. To prevent this, a low voltage is applied to P+ regions 220a to 220h, which attracts any holes accumulated near gates 216a to 216d, thereby preventing the above-mentioned parasitic current. (In one embodiment of the invention, lead 218 is electrically connected to lead 222. However, in another embodiment, lead 218 is not electrically connected to lead 222 so that the voltages applied to leads 218 and 222 are mutually independent.)

In one embodiment in which lead 218 does not connect to lead 222, transistor 200 can be operated in a mode wherein a high voltage is applied to regions 220a to 220h, to thereby forward bias the junctions between regions 220a to 220h and N− region 204, and thus reduce the source-drain resistance of transistor 200. Thus, transistor 200 can be operated in the bipolar mode of operation. (The bipolar mode of operation of field effect transistors is described by B. Jayant Baliga in a book entitled "Modern Power Devices," published by John Wiley & Sons in 1987, pages 175 to 182, incorporated herein by reference.)

As can be seen in FIG. 5, portions P1 and P2 of silicon dioxide layer 214b adjacent substrate 202 and region 206 are relatively thick compared to a portion P3 of silicon dioxide layer 214b. (Similarly, silicon dioxide layers 214a, 214c and 214d include portions adjacent regions 206 and substrate 202 which are relatively thick compared to the portions of silicon dioxide adjacent regions 204.) Of importance, because of the thickness of portions P1 and P2, the electric field generated in the portions of regions 206 and substrate 202 adjacent regions P1 and P2 by the gate voltage is attenuated. Thus, if the depletion region caused by application of a low voltage to gates 216a to 216d extends into N+ substrate 202 or N+ source 206, the electric field caused by gates 216a to 216d is less likely to cause premature field induced breakdown of the junction between the depletion region and the drain or the junction between the depletion region and the source than if portions P1 and P2 were as thin as portion P3.

It is noted that regions 206 are not formed on the left side of gate 216a or on the right side of gate 216d. Thus, transistor 200 terminates at gates 216a and 216d. However, in other embodiments, the cross section of the transistor includes more than just four gate regions.

Figure 6A:
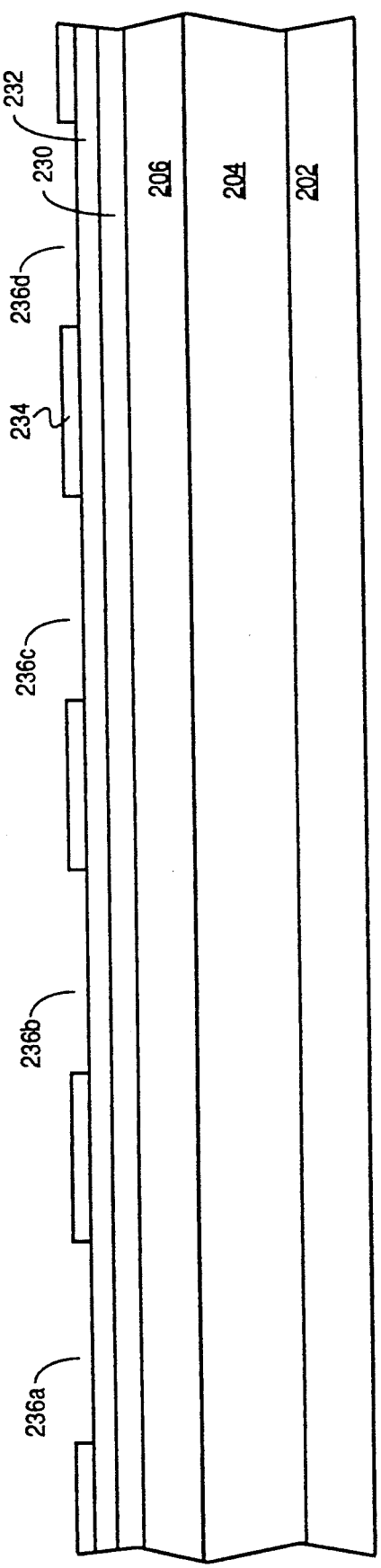

A process for manufacturing transistor 200 is illustrated in FIGS. 6a to 6j. Referring to FIG. 6a, the process begins by forming N− layer 204 and N+ layer 206 on an N+ substrate 202. In one embodiment, substrate 202 is an N+ silicon substrate having a [100] crystal orientation and a dopant concentration of about $10^{19}$/cc. N− region 204 is typically epitaxially grown silicon having a dopant concentration of about $10^{14}$ to $10^{17}$/cc and a thickness of about 1000 to 5000 nm. N+ region 206 typically has a dopant concentration of about $10^{19}$ to $10^{20}$/cc and a thickness of 500 to 1000 nm. In one embodiment of our invention, region 206 is formed by implantation or diffusion of a suitable impurity into N− epitaxial layer 204. The lateral extent of N+ region 206 is limited using a conventional technique, e.g. a photomask.

A SiO₂ layer 230 is then thermally grown on N+ region 206 to a thickness of about 300 to 1500 nm, and a Si₃N₄ layer 232 is formed on SiO₂ layer 230 to a thickness of 50 nm to 400 nm, e.g., by chemical vapor deposition. Thereafter, a photoresist layer 234 is formed on Si₃N₄ layer 232 and then patterned using conventional techniques to form window regions 236a to 236d, thereby exposing portions of underlying Si₃N₄ layer 232. Window regions 236a to 236d define the lateral extent of subsequently formed grooves 212a to 212d where polysilicon gates are to be formed.

Figure 6B:
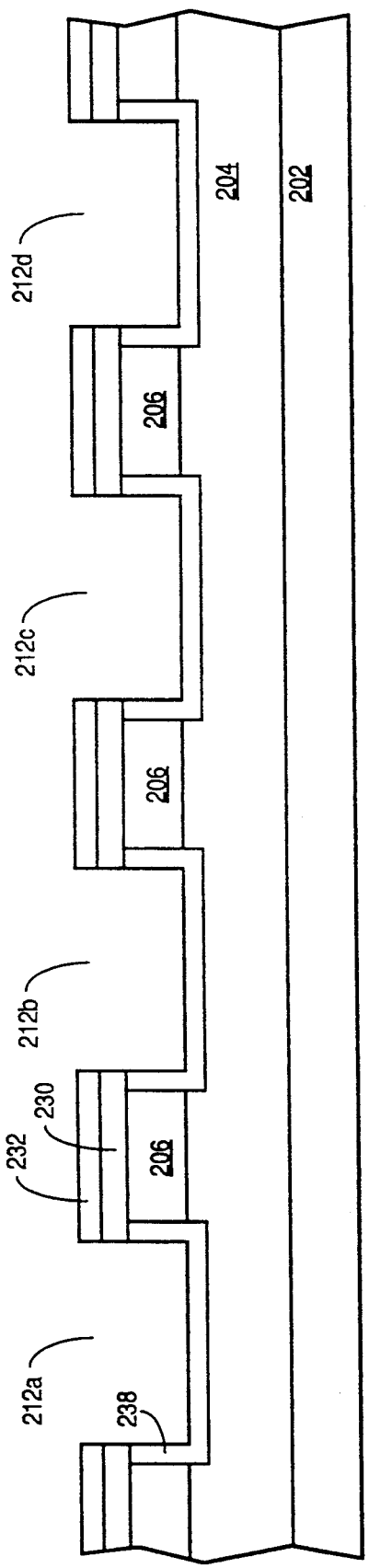

Referring to FIG. 6b, the exposed portions of Si₃N₄ layer 232 are then removed along with the underlying portions of SiO₂ layer 230 and N+ region 206, thereby forming grooves 212a to 212d. In one embodiment, this etching step is performed using a dry etching process such as reactive ion etching, sputter etching, ion milling, or plasma etching. Photoresist layer 234 is then removed.

Figure 6C:
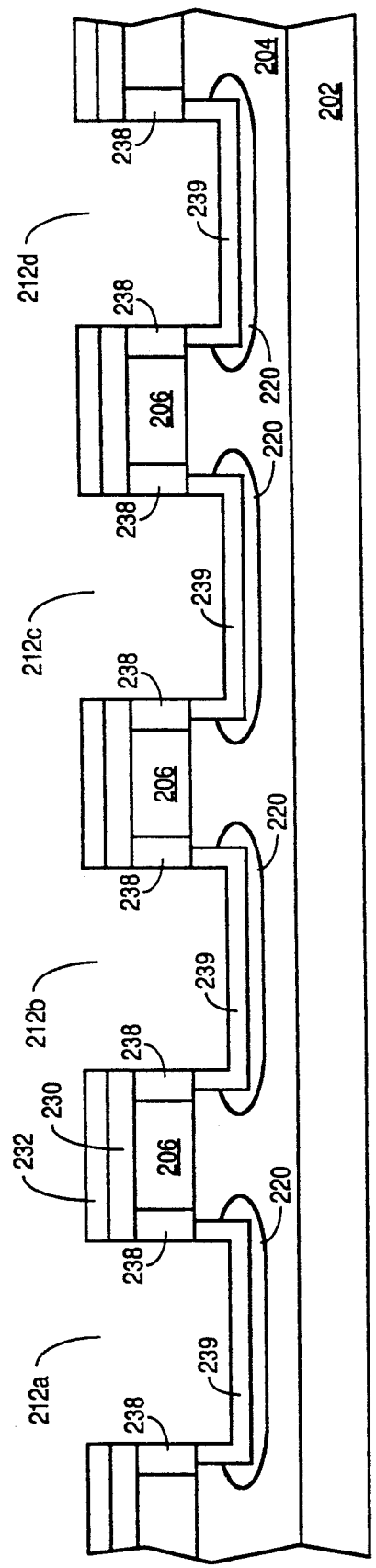

A SiO₂ layer 238 is then thermally grown on the walls of grooves 212a to 212d, e.g. to a thickness of 50 to 300 nm. The wafer is then subjected to another etching step in which grooves 212a to 212d are extended by a distance of about 0.5 to 2.0 μm through a portion of N− layer 204. In one embodiment, this is done using a dry etching process. The wafer is then subjected to another thermal oxidation process in which a SiO₂ layer 239 is thermally grown on the walls of grooves 212a to 212d (FIG. 6c). In one embodiment, SiO₂ layer 239 is formed to a thickness of about 10 to 250 nm. Of importance, the thickness of SiO₂ layer 238 also slightly increases during this step.

P type impurities such as boron are then introduced into the portion of epitaxial layer 204 at the bottom of grooves 212a to 212d, e.g. by ion implantation. The impurities are then diffused to form P+ regions 220. In one embodiment, P+ regions 220 have a dopant concentration of $10^{17}$/cc. As described in greater detail below, P+ regions 220 serve as hole sinker regions which absorb holes and prevent a P type inversion layer from forming along the gate oxide.

The wafer is then subjected to another etching step to extend grooves 212a to 220d to the interface 240 between N− layer 204 and N+ substrate 202 (FIG. 6d). The wafer is then covered with an Si₃N₄ layer 242, e.g. to a thickness of about 50 to 400 nm, using chemical vapor deposition. The wafer is then subjected to another dry vertical etching process to remove the portion of Si₃N₄ layer 242 on the bottom of grooves 212a to 212d (FIG. 6e). It is noted that the portions of Si₃N₄ layer 242 on the top surface of the wafer are also removed during this step. However, this etching step is carefully timed to avoid removing Si₃N₄ layer 232. Of importance, the portions of Si₃N₄ layer 242 on the side walls of grooves 212a to 212d remain at the conclusion of this etching step.

The wafer is subjected to another etching step to extend grooves 212a to 212d, e.g. about 100 to 700 nm below the interface between N+ substrate 202 and N− epitaxial layer 204. The wafer is then subjected to another thermal oxidation step to thereby form SiO$_2$ layers 244 on the bottom of grooves 212a to 212d, e.g. to a thickness of 50 to 500 nm. The remaining portions of Si$_3$N$_4$ layers 232 and 242 prevent the thickness of the SiO$_2$ elsewhere on the wafer from increasing during this step. (In another embodiment the wafer is not subjected to another etching step between the time the portions of Si$_3$N$_4$ layer 242 on the bottom of the grooves are removed and the time SiO$_2$ layers 244 are formed.) Of importance, SiO$_2$ layers 244 are thicker than SiO$_2$ layers 239.

Figure 6F:
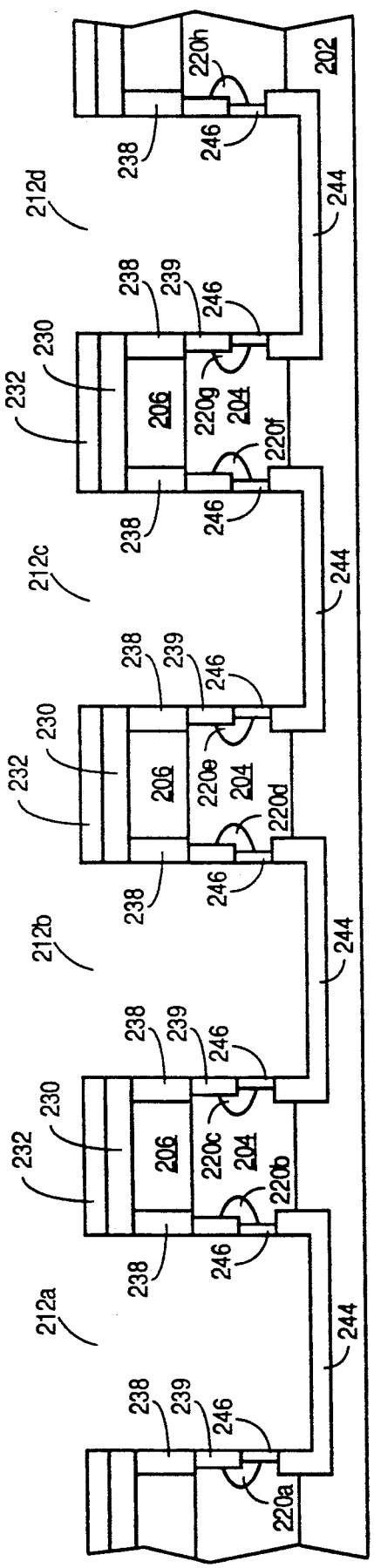

The remaining portion of Si$_3$N$_4$ layer 242 is then removed, e.g., by placing the wafer in a phosphoric acid etching solution. Of importance, this etching step is timed so that a portion of Si$_3$N$_4$ layer 232 remains at the conclusion of this step. The wafer is then subjected to another thermal oxidation process to form SiO$_2$ layer 246 in grooves 212a to 212d (FIG. 6f). SiO$_2$ layer 246 is typically 10 to 150 nm thick. Of importance, SiO$_2$ layers 238, 239, and 244 increase during formation of SiO$_2$ layer 246. In one embodiment, the thicknesses of layers 238, 239 and 244 increase to 350 nm, 100 nm, and 280 nm, respectively.

Figure 6G:
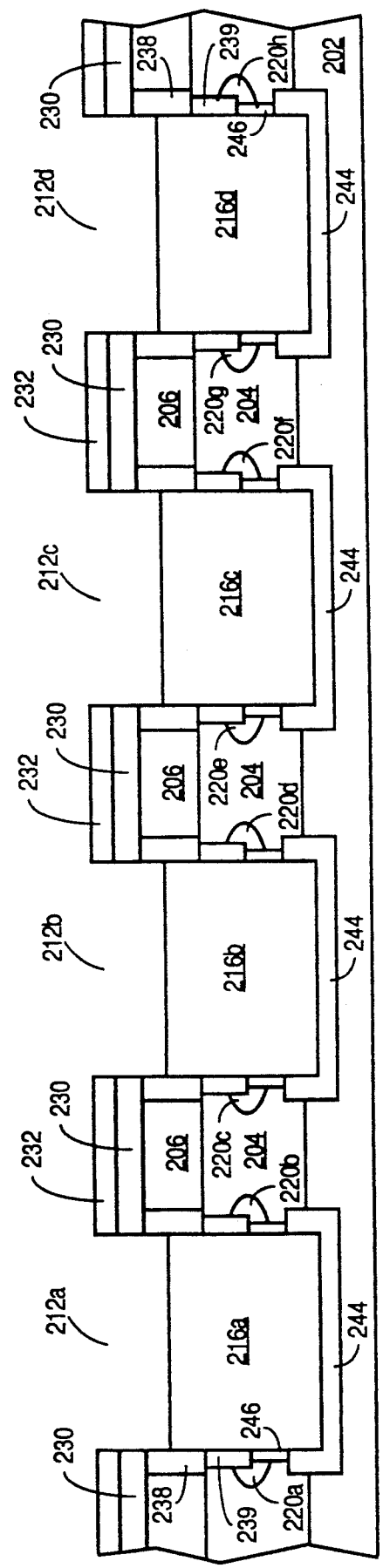

The wafer is then covered with a doped polysilicon layer which is then subjected to a vertical etching process so that at the conclusion of the etching process, only polysilicon gates 216a to 216d in grooves 212a to 212d remain (FIG. 6g). Of importance, the upper surface of polysilicon gates 216a to 216d is approximately 0 to 0.5 $\mu$m below the upper surface of region 206.

Figure 6H:
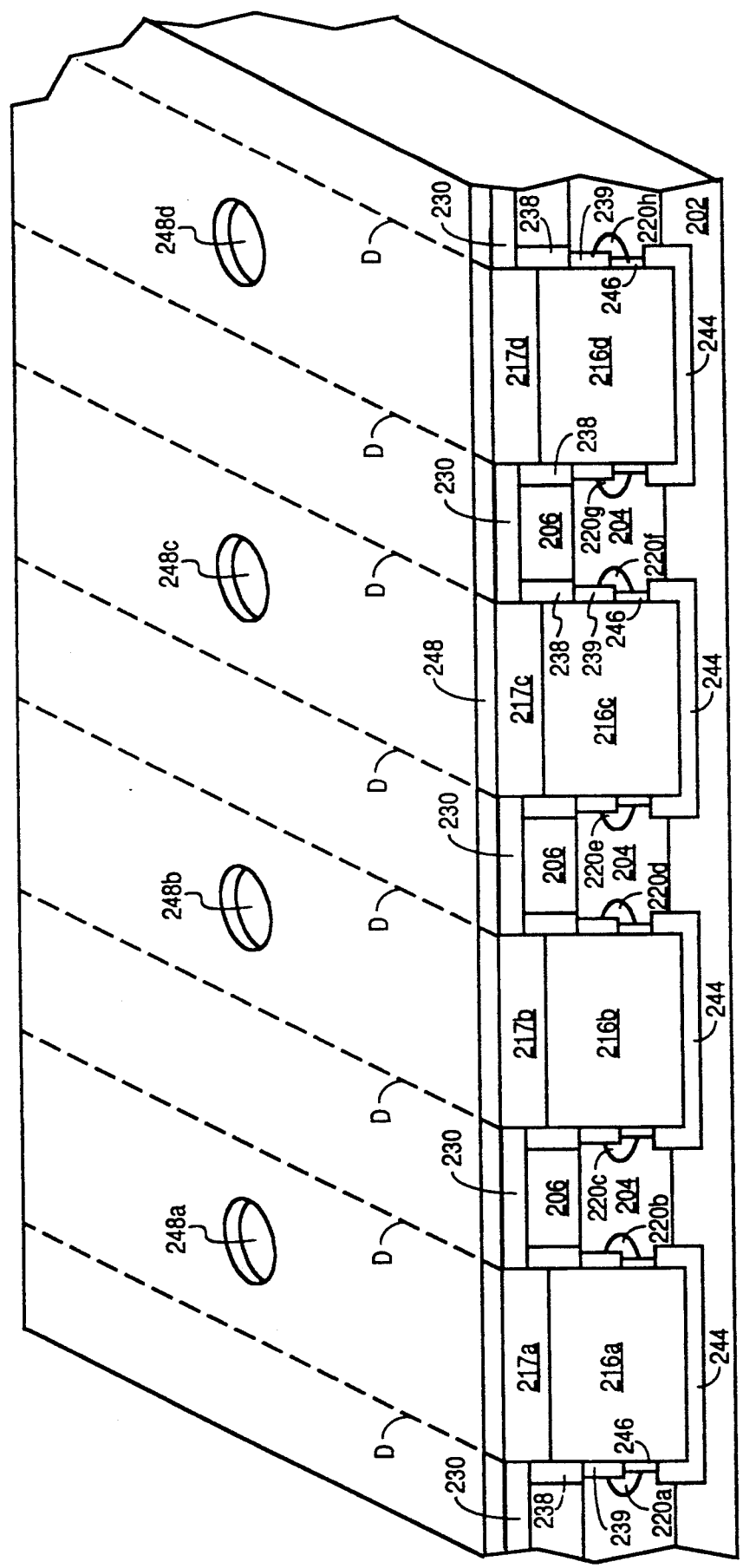

The wafer is then subjected to another thermal oxidation step to form thick oxide regions 217a to 217d above gates 216a to 216d, respectively (FIGS. 6h). Oxide regions 217a to 217d are typically 2000 to 6000Å thick. (Si$_3$N$_4$ layer 232 prevents the thickness of SiO$_2$ layer 230 from increasing during the step or forming layers 217a to 217d.) Thereafter, the remaining portions of Si$_3$N$_4$ layer 232 are removed, e.g. by placing the wafer in phosphoric acid. The wafer is then covered with a photoresist layer 248 which is then patterned to form window regions 248a to 248d which define where electrical contact is to be made to gates 216a to 216d, respectively, as illustrated in FIG. 6h. (FIG. 6h illustrates the wafer in cross section and a portion of the top surface of the wafer. Dotted lines D drawn on the wafer surface illustrate the lateral extent of SiO$_2$ layers 217a to 217d underneath photoresist layer 248.) As can be seen in FIG. 6n, electrical contact to gates 216a to 216d is not made in the same cross section plane as the cross section of FIGS. 6a to 6g. The portion of SiO$_2$ regions 217a to 217d within window regions 248a to 248d is then removed, e.g. by placing the wafer in a HF solution or subjecting the wafer to a dry etching process, thereby exposing portions of gates 216a to 216d. Photoresist layer 248 is then removed.

Figure 6I:
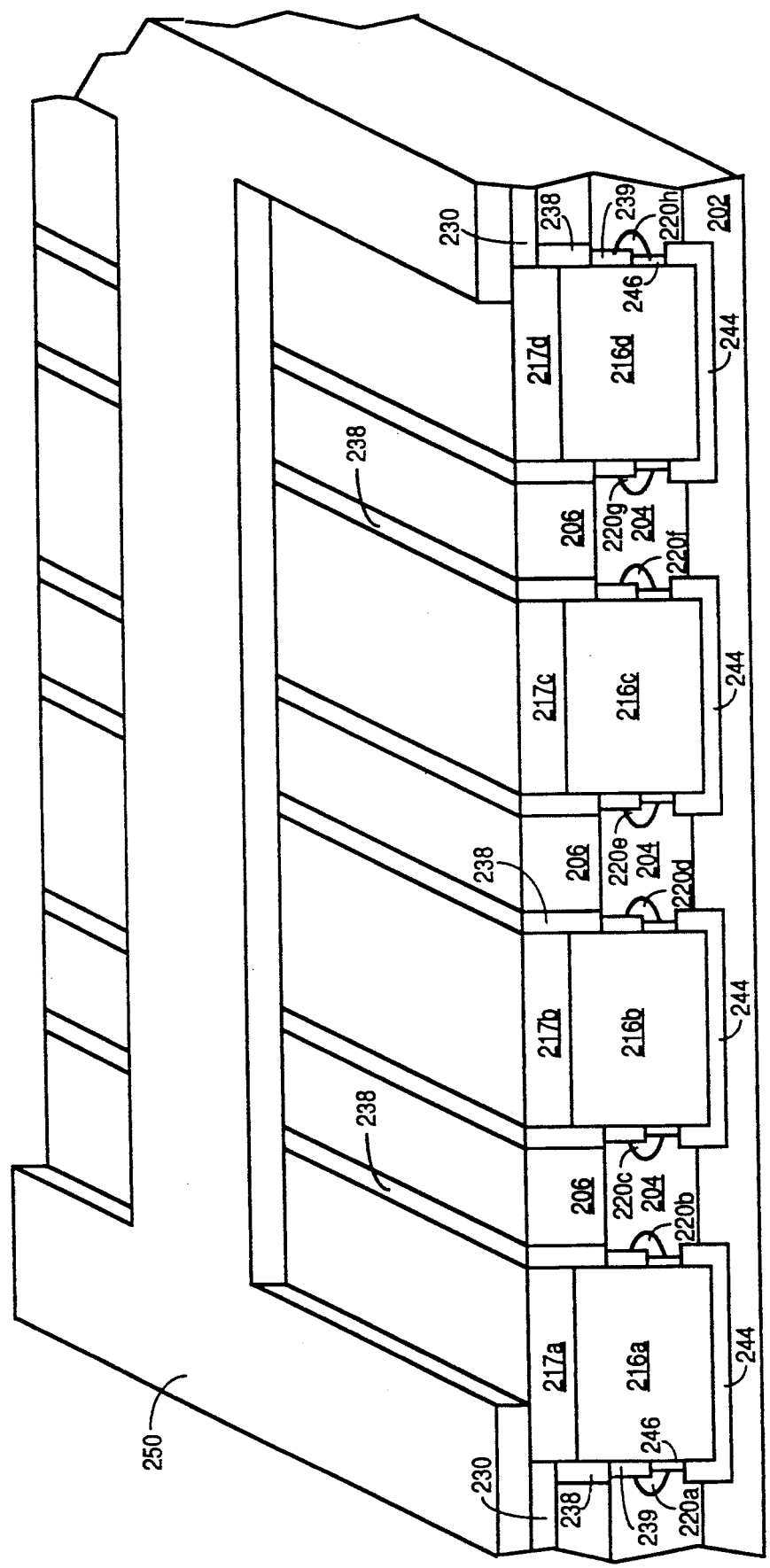

The wafer is then covered with a photoresist layer 250 which is then patterned as illustrated in FIG. 6i, thereby exposing portions of the wafer surface. The wafer is then subjected to a SiO$_2$ etching process, e.g., by placing the wafer in an HF solution, and then removing the wafer from the solution. This results in the removal of SiO$_2$ layer 230 from the exposed portions of the wafer surface which is where source contact metallization is to be formed. Of importance, because of the thickness of the exposed portions of SiO$_2$ layers 217a to 217d, only an insignificant portion of SiO$_2$ layers 217a to 217d is removed during this process.

Figure 6J:
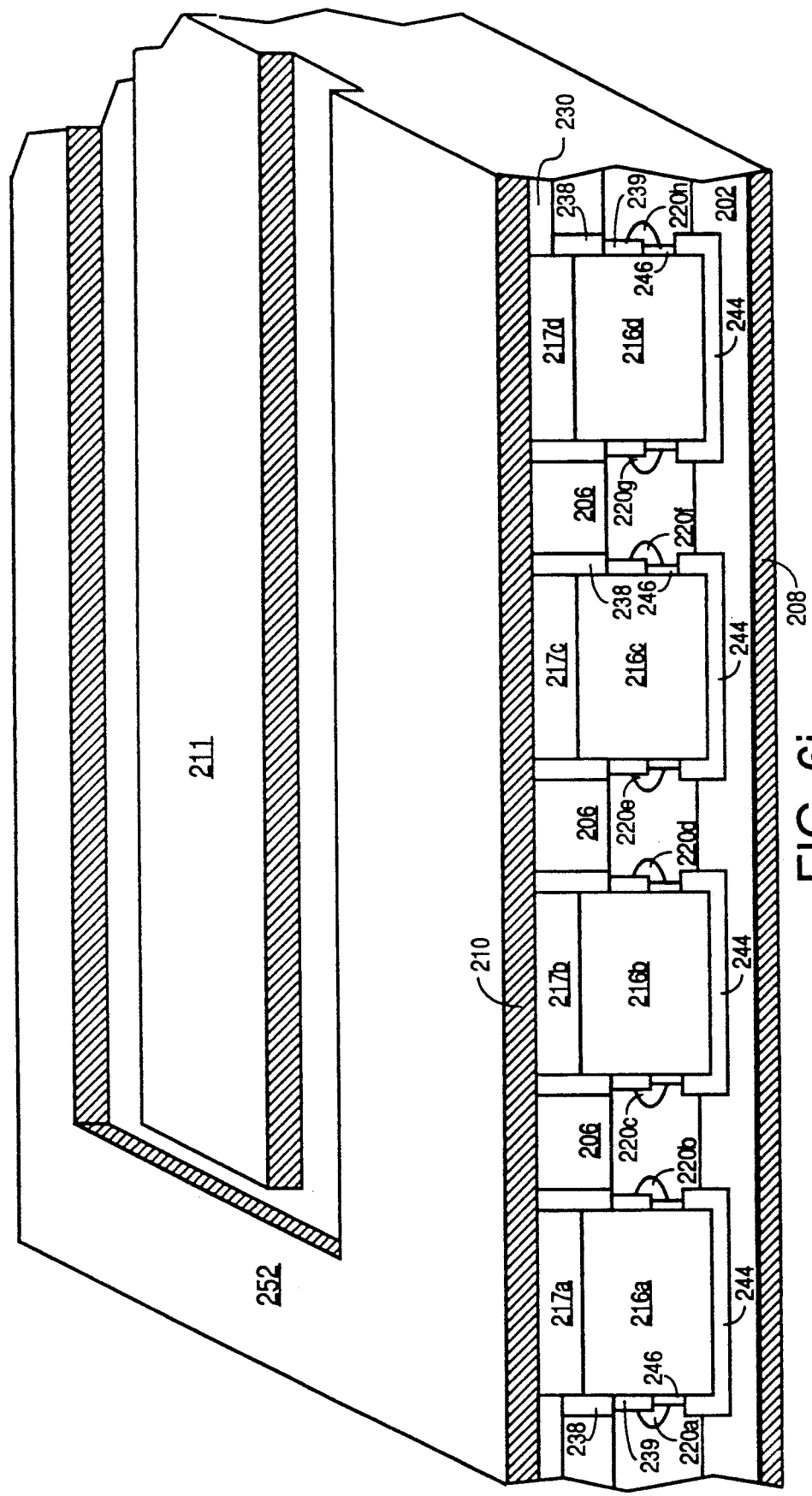

Photoresist 250 is then removed and the wafer is covered with metallization layer 252, e.g., by sputtering or evaporation (FIG. 6j). In one embodiment, metallization layer 252 is aluminum or an alloy of aluminum. Metallization layer 252 is then patterned, e.g., using conventional techniques, to form a portion 210 for electrically contacting source regions 206 and a portion 211 for electrically contacting gates 216a to 216d. Drain contact metallization 208 is then applied (e.g. by evaporation or sputtering) to the bottom of substrate 202.

Figure 7A:
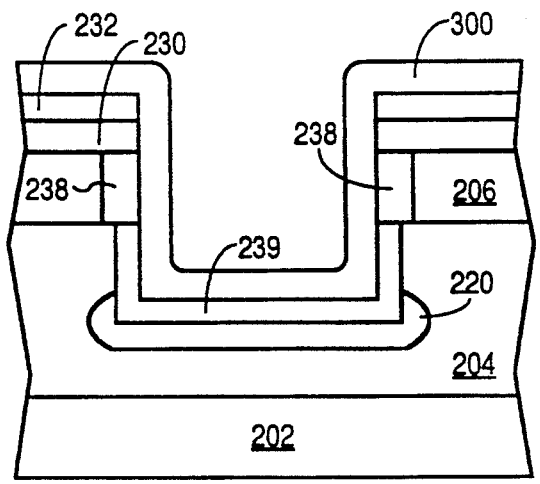
FIGS. 7a to 7f illustrate in cross section a second portion of the JMOS transistor of FIG. 5 during the manufacturing process of the second embodiment.
Figure 7B:
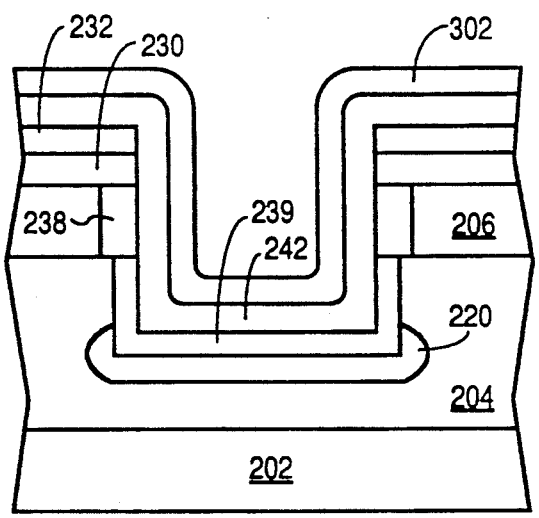
Figure 7C:
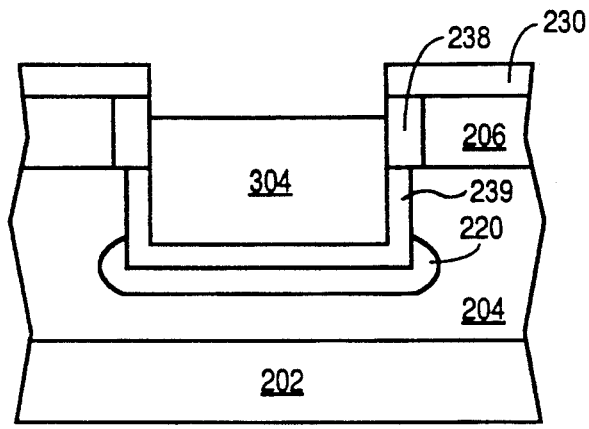

As mentioned above, it is necessary to electrically contact P+ region 220a to 220h. FIGS. 7a to 7f illustrate in cross section a portion of one of grooves 212a to 212d outside of the cross section plane of FIGS. 6a to 6j during the process of contacting regions 220a to 220h. Of importance, structures similar to that illustrated in FIGS. 7a to 7f are formed along each of grooves 212a to 212d. In one embodiment, prior to the step in which grooves 212a to 212d are extended through P+ regions 220, a photomask 300 (FIG. 7a) is applied to a portion of each of grooves 212a to 212d outside of the cross section of FIGS. 6a to 6j. Photomask 300 protects the underlying silicon during this etching step. After grooves 212a to 212d are extended to the interface between N− layer 204 and N+ substrate 206, photomask 300 is removed, and the wafer is covered with Si$_3$N$_4$ layer 242 as described above and illustrated in FIGS. 6d and 7b. However, prior to removing the portion of Si$_3$N$_4$ layer 242 on the bottom of grooves 212a to 212d, a photomask 302 is applied to the wafer to protect the portion of the grooves where contact to P+ region 220 is to be made (FIG. 7b). The wafer is then subjected to the vertical Si$_3$N$_4$ etching process and grooves 212a to 212d are extended into substrate 202 as described above in relation to FIG. 6e. Photomask 302 protects the underlying portion of layer 242 during this step. Photomask 302 is then removed.

The wafer is then subjected to the thermal oxidation step to form SiO$_2$ layer 244 and the blanket Si$_3$N$_4$ etching step described above in relation to FIG. 6e, and subjected to the thermal oxidation step used to form SiO$_2$ layer 246. The wafer is then covered with polysilicon which is then etched to form gates 216a to 216d. At the conclusion of this step, the portion of the grooves where P+ region 220 is to be electrically contacted is also filled with polysilicon, illustrated as polysilicon 304 in FIG. 7c.

Figure 7D:
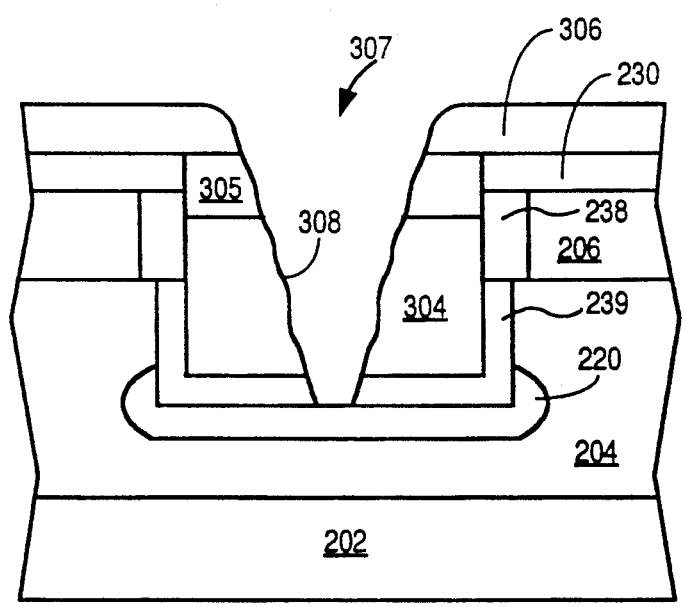
Figure 7E:
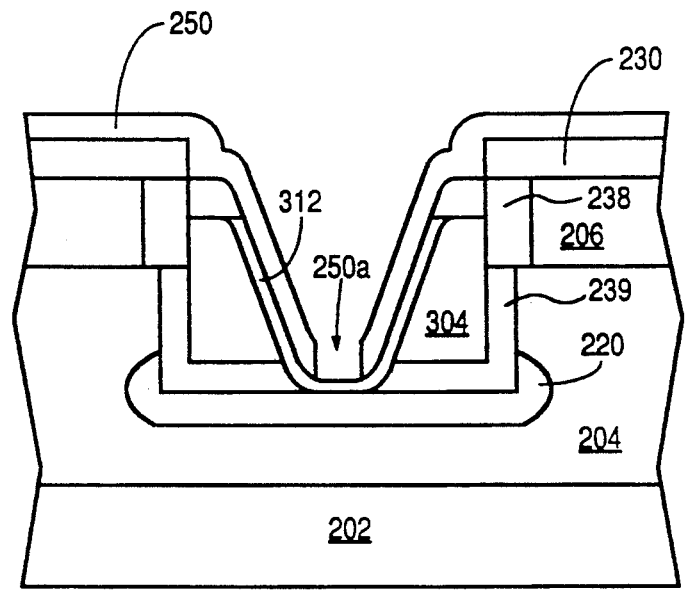
Figure 7F:
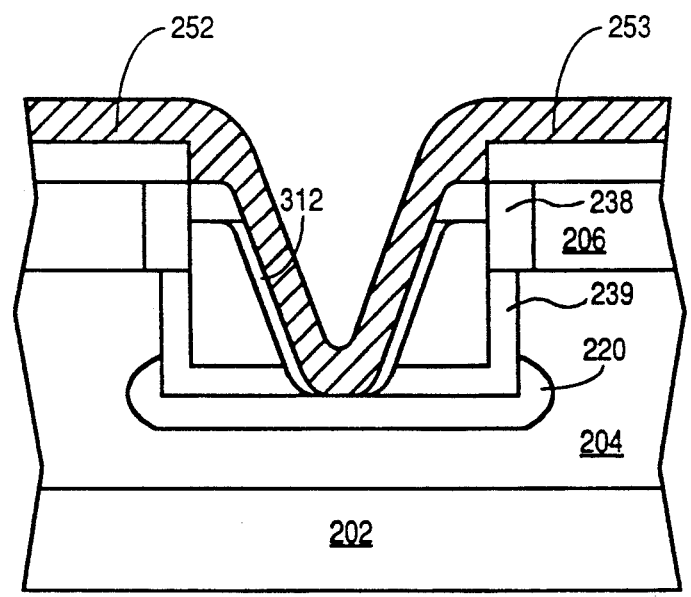

The wafer processing continues up until the point where SiO$_2$ regions 217a to 217d are grown. A corresponding SiO$_2$ layer 305 is concurrently grown of polysilicon 304. The wafer is then covered with a photoresist layer 306 which is then patterned to define an area where a portion of polysilicon 304 is to be removed (FIG. 7d). The wafer is then subjected to an etching process to form a groove 307 within polysilicon 304. Of importance, this process is typically a dry etching process such as a plasma or reactive ion etching process. The process parameters are typically controlled so that resulting groove 307 has a sloped sidewall 308. The etching parameters used to achieve a sloped sidewall typically depend on the type of etching apparatus used. In one embodiment, a Triode Etcher, Model Number 606, manufactured by GCA Corp. is used to etch grooves 307. The process gas typically comprises SF$_6$, C$_2$F$_6$, or CHF$_3$, or a mixture thereof, a gas flow rate of about 180 SCCM, a gas pressure of about 135 mTorr, and a plasma bias of about −450 volts. This is done so that it is easier to form subsequently deposited metal in groove 307 to contact P+ region 220. SiO₂ layer 239 underneath polysilicon 304 is removed during this step, thereby exposing a portion of P+ region 220. Photomask 306 is then removed. A thin SiO₂ layer 312 is then thermally grown on the inner wall of groove 307 (FIG. 7e).

The wafer is then subjected to the above-mentioned SiO₂ etching process in which SiO₂ layers 217a to 217d are etched where gate contacts are to be formed. Groove 307 is protected by photoresist layer 248 during this step. Photoresist layer 248 is then removed. Photoresist layer 250 is applied to the wafer, and the wafer is subjected to the etching step during which SiO₂ layer 230 is etched. Of importance, photoresist layer 250 is patterned to include a window region 250a (FIG. 7e) so that during the step of etching SiO₂ layer 230 where the source is to be contacted, the portion of SiO₂ layer 312 at the bottom of groove 307 is removed. The wafer processing continues as described above. Thus, photoresist layer 250 is removed and metallization layer 252 is deposited on the wafer. When metallization 252 is patterned, a portion 253 (FIG. 7f) of metallization 252 contacts P+ region 220, which in turn is contiguous with two of P+ regions 220a to 220h. Portion 253 of metallization 252 is used to apply a voltage to the two P+ regions. The other P+ regions within regions 220a to 220h are contacted in a similar manner.

It is noted the above process for contacting P+ regions 220 requires forming window region 250a in photomask 250 at the bottom of groove 307. To facilitate forming this window region, in one embodiment, the portion of grooves 212a to 212d where regions 220 are to be contacted is wider than the portion of the grooves in the active areas of the wafer.

Figure 8A:
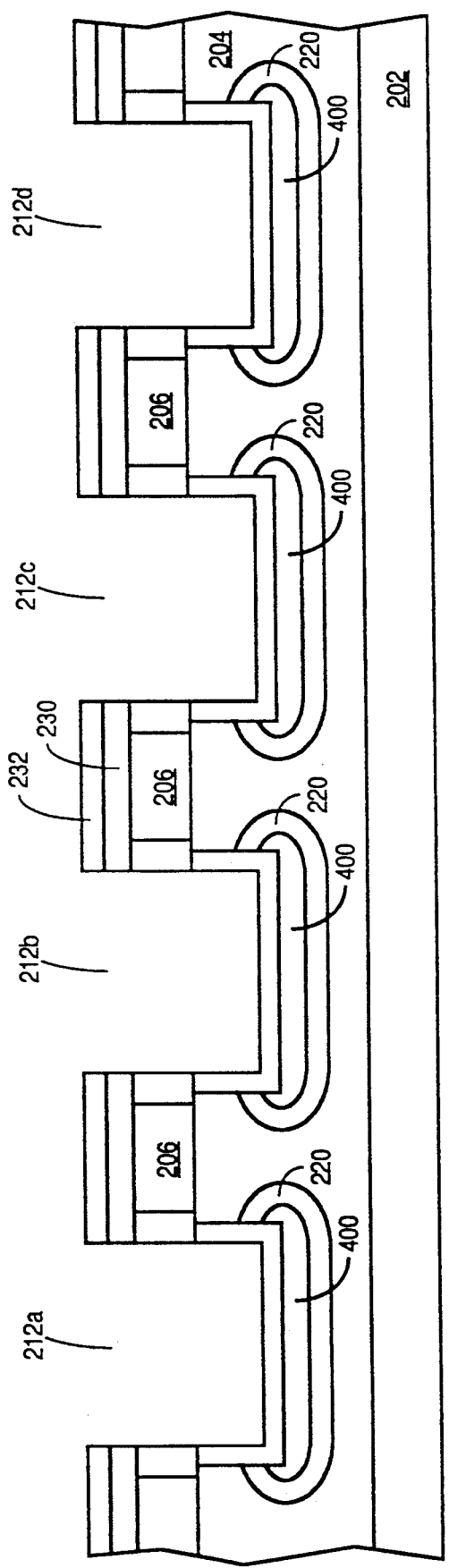
FIGS. 8a and 8b illustrate a first portion of a JMOS transistor during a manufacturing process in accordance with a third embodiment of the invention.
Figure 8B:
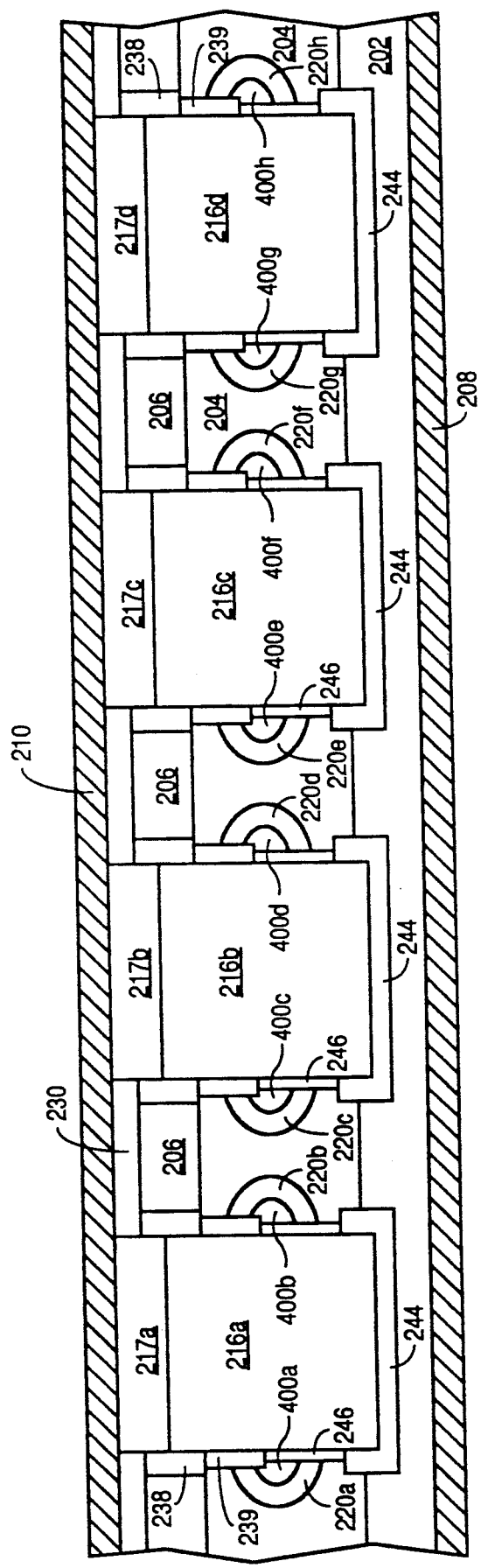
Figure 9A:
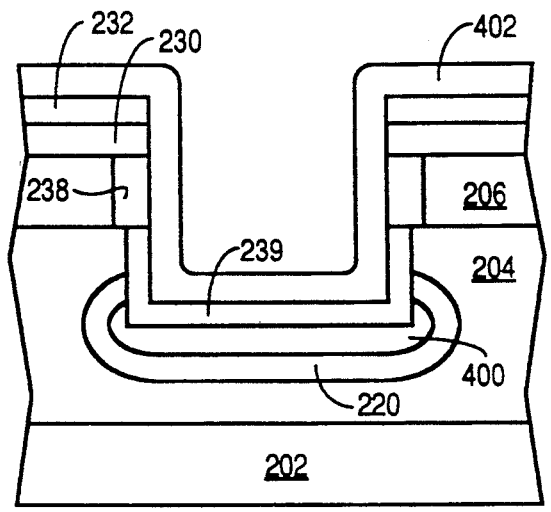
FIGS. 9a to 9e illustrate a second portion of the JMOS transistor of FIGS. 8a and 8b during the manufacturing process of the second embodiment.
Figure 9B:
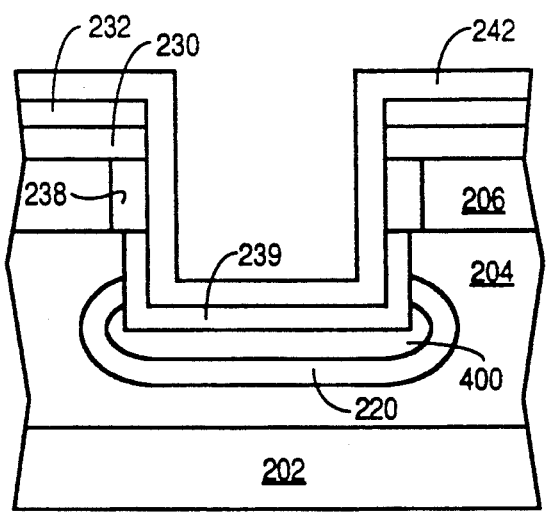
Figure 9C:
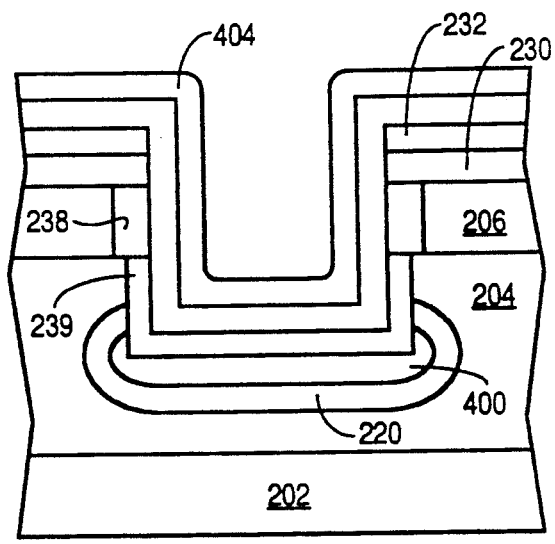
Figure 9D:
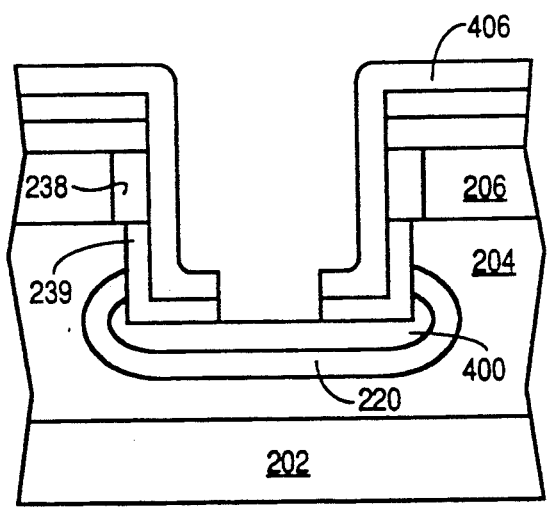

FIGS. 8a, 8b and 9a to 9e illustrate an alternative method for contacting P+ region 220. FIG. 8a and 8b illustrate the transistor along the same cross section plane as FIGS. 6a to 6j, while FIGS. 9a to 9e illustrate a portion of the transistor along the cross section plane where P+ regions 220 are to be electrically contacted. Referring to FIG. 8a, after P+ regions 220 are formed in the wafer (see FIG. 6c), the wafer is implanted with N type dopants, thereby forming a set of N+ regions 400 within P+ regions 220. Outside of the cross section of FIG. 8a, after N+ region 400 and P+ region 220 are formed, a portion of the wafer is covered by photomask 402 as illustrated in FIG. 9a. Grooves 212a to 212d are extended as indicated in the discussion referencing FIG. 6d above. Of importance, the portions of grooves 212a to 212d protected by photomask 402 are not extended during this process step. Photomask 402 is then removed, and the wafer is covered by Si₃N₄ layer 242 described above with reference to FIG. 6d. At the point in the manufacturing process after Si₃N₄ layer 242 is formed, the portion of the cross section where regions 220 are to be contacted is illustrated in FIG. 9b. Prior to etching the portion of Si₃N₄ layer 242 as described above in relation to FIG. 6e, the wafer is covered by a photoresist layer 404 to protect the portion of Si₃N₄ layer 242 in the area where region 220 is to be contacted. (See FIG. 9c.)

The portions of Si₃N₄ layer 242 and the underlying semiconductor substrate within the area illustrated by FIGS. 8a and 8b are then etched. Of importance, photoresist layer 404 protects the underlying portion of Si₃N₄ layer 242 within the cross section plane of FIGS. 9a to 9e. After the step of etching the exposed portions of Si₃N₄ layer 242, photoresist layer 404 is removed. The manufacturing process continues is described above until polysilicon gates 216a to 216d are to be formed. Prior to forming polysilicon gates 216a to 216d, the wafer is covered with a photomask 406 (FIG. 9d), which is patterned to form a window region 406a, thereby exposing portions of SiO₂ layer 239 in the portion of the wafer illustrated in FIGS. 9a to 9e. To facilitate formation of window 406a, in one embodiment, the portion of the grooves illustrated in FIGS. 9a to 9e is wider than the portion of the grooves illustrated in FIGS. 8a and 8b. The exposed portions of SiO₂ layer 239 are then removed, e.g. by placing the wafer in a HF solution. The wafer is then removed from the HF solution, photomask 406 is removed, and polysilicon gates 216a to 216d are formed on the wafer. In the embodiment of FIGS. 8a, 8b and 9a to 9e, gates 216a to 216d are heavily doped with N type impurities.

Figure 9E:
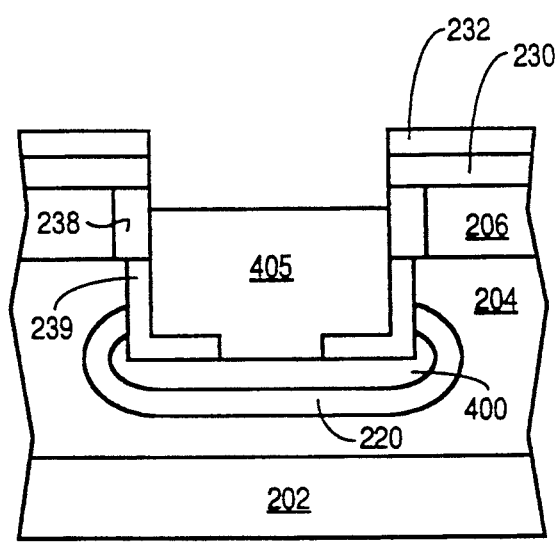

FIG. 9e illustrates the portion of the wafer where N+ region 400 is to be electrically contacted after the polysilicon gate structures are formed. Of importance, the polysilicon illustrated in FIG. 9e (designated as polysilicon 405) electrically contacts N+ region 400, which in turn forms a PN junction with P+ region 220. The process of the transistor continues above as described in relation to FIGS. 6g to 6j. FIG. 8b illustrates the transistor at the conclusion of the manufacturing process along the cross section plane of FIG. 8a. Of importance, the polysilicon gates contact N+ regions 400a to 400h, which in turn form PN junctions with P+ regions 220a to 220h. When a low voltage is applied to gates 216a to 216d, that voltage is also applied to N+ regions 400a to 400h, which causes the PN junctions between N+ regions 400a to 400h and P+ regions 220a to 220h to turn on, thereby causing application of a low voltage to P+ regions 220a to 220h. In this way, when a low voltage is applied to the gate of the transistor, a low voltage is applied to P+ regions 220a to 220h, to thereby serve as a sink for holes accumulating in the transistor channel region. However, if the voltage at gates 216a to 216d is increased (e.g. to cause an accumulation of electrons in the channel region and to reduce the resistance between source 206 and drain 202), the PN junction between regions 220a to 220d and N+ regions 400a to 400h is reverse-biased, and the voltage at P+ regions 220a to 220d will not increase to inject holes into the transistor channel region.

In yet another embodiment or our invention, the portion of the polysilicon serving as gates 216a to 216d is disconnected from the portion of the polysilicon which contacts N+ regions 400 by an etching step. Thus, in this embodiment, a voltage can be applied to N+ regions 400 independent of the transistor gate voltage.

In yet another embodiment, N+ region 400 is not formed, gates 216a to 216d are heavily doped with P type impurities, and polysilicon 405 directly contacts P+ region 220. In this embodiment, polysilicon 405 can either be contiguous with one of gates 216a to 216d or to be disconnected from gates 216a to 216d so that independent voltages can be applied to P+ regions 220 and gates 216a to 216d.

While the invention has been described in detail with regard to specific embodiment, those skilled in the art will realize that changes can be made in form and detail without departing from the spirit and scope of the invention. For example, the conductivity type of the transistor described herein can be reversed by changing the conductivity type of the various semiconductor regions.

Also, semiconductor materials other than silicon can be used. Accordingly, all such changes come within the present invention.

We claim:

1. A method for manufacturing a transistor comprising the steps of:
    providing a structure comprising a P-type first semiconductor region, a P-type second semiconductor region on said first region, said second region having a dopant concentration less than a dopant concentration of said first region, an N-type third semiconductor region formed on said second semiconductor region, and a P-type fourth semiconductor region formed on said third semiconductor region;
    etching a trench through said fourth, third and second semiconductor regions;
    forming an insulating layer in said trench, a portion of said insulating layer adjacent said first semiconductor region being thicker than a portion of said insulating layer adjacent said third semiconductor region; and
    forming a gate in said trench.

2. The method of claim 1 wherein said step of etching a trench comprises the step of etching said trench through a portion of said first semiconductor region.

3. The method of claim 1, wherein a portion of said insulating layer adjacent said first and second regions is thicker than a portion of said insulating layer adjacent said third region.

4. The method of claim 1, wherein a portion of said insulating layer adjacent said fourth region is thicker than a portion of said insulating layer adjacent said third region.

5. A method for forming a transistor comprising the steps of:
    forming a structure comprising a first region of semiconductor material of a first dopant concentration and a first conductivity type, and a second region of semiconductor material of said first conductivity type and a second dopant concentration greater than said first dopant concentration formed on said first region;
    etching a plurality of grooves, said grooves extending through said second region and at least a portion of said first region;
    forming a plurality of insulating layers, each insulating layer within said plurality being formed in an associated one of said grooves, said insulating layers each having a first insulating region adjacent said first region having a first insulating region adjacent said first region of semiconductor material, said insulating layers each having a second insulating region adjacent said second region of semiconductor material, said second insulating region being thicker than said first insulating region;
    forming a gate structure within each of said grooves, said gate structure being insulated from said first and second regions by said insulating layers; and
    forming a plurality of semiconductor regions of a second conductivity type within said first region adjacent to said plurality of insulating layers for removing current carriers of said second conductivity type from said first region.

6. A method for manufacturing a transistor comprising the steps of:
    providing a structure comprising a first semiconductor region of a first conductivity type, a second semiconductor region of said first conductivity type on said first region, said second region having a dopant concentration less than a dopant concentration of said first region, a third semiconductor region of a second conductivity type opposite said first conductivity type formed on said second semiconductor region, and a fourth semiconductor region of said first conductivity type formed on said third semiconductor region;
    etching a trench through said fourth, third and second semiconductor regions;
    forming an insulating layer in said trench, a portion of said insulating layer adjacent said first semiconductor region being thicker than a portion of said insulating layer adjacent said third semiconductor region; and
    forming a gate in said trench,
    wherein said insulating layer forming step comprises the steps of:
    masking sidewalls of said trench with a mask;
    forming an insulator on a surface of said trench below said mask;
    removing said mask from the sidewalls; and
    forming an insulator on a surface of said trench.

7. The method of claim 6 wherein said step of forming an insulator on a surface of said trench below said mask comprises the step of thermally growing $SiO_2$.

8. The method of claim 6, wherein said masking step comprises:
    depositing said mask on said structure and a surface of said trench, and
    etching said mask by a vertical etching process until at least a portion of said mask is removed from a bottom of said trench.

9. The method of claim 8, wherein said first, second and third regions contain silicon;
    wherein said depositing step comprises depositing $Si_3N_4$ by chemical vapor deposition; and
    wherein each said insulator forming step comprises a step of growing $SiO_2$.

10. The method of claim 6, further comprising, after said masking step, the step of extending said trench into said first region.

11. A method for manufacturing a transistor comprising the steps of:
    providing a structure comprising a first semiconductor region of a first conductivity type, a second semiconductor region of said first conductivity type on said first region, said second region having a dopant concentration less than a dopant concentration of said first region, a third semiconductor region of a second conductivity type opposite said first conductivity type formed on said second semiconductor region, and a fourth semiconductor region of said first conductivity type formed on said third semiconductor region;
    etching a trench through said fourth, third and second semiconductor regions;
    forming an insulating layer in said trench, a portion of said insulating layer adjacent said first semiconductor region being thicker than a portion of said insulating layer adjacent said third semiconductor region; and
    forming a gate in said trench,
    wherein said etching step comprises the steps of:
    etching said trench through said fourth region; and
    extending said trench at least through said third region; and wherein said process further comprises, between said step of etching through said fourth region and said extending step, the step of forming a first insulator on walls of said trench.

12. A method of making a transistor comprising the steps of:
   providing a P-type first semiconductor region;
   providing a P-type second semiconductor region adjacent said first region, said second region having a dopant concentration less than a dopant concentration of said first region;
   providing an N-type third semiconductor region adjacent said second region;
   providing a P-type fourth semiconductor region adjacent said third region;
   etching a plurality of grooves through said fourth, third and second regions;
   forming an insulating layer in said grooves, a first portion of said insulating layer adjacent said first region being thicker than a second portion of said insulating layer adjacent said third region, said second portion being formed on sidewalls of said grooves; and
   forming a conductor in said grooves.

13. A method for making a transistor comprising the steps of:
   providing a first semiconductor region of a first conductivity type;
   providing a second semiconductor region of said first conductivity type on said first region, said second region having a first portion having a dopant concentration less than a dopant concentration of said first region;
   forming a first groove in said second region;
   extending said first groove to at least said first region;
   forming a first insulator on a bottom of said first groove;
   forming a second insulator on the bottom and sidewalls of said first groove; and
   forming a first conductor in said groove,
   said method further comprising, between said groove forming and extending steps, the step of providing a third semiconductor region of a second conductivity type opposite said first conductivity type adjacent a bottom of said first groove and contained within said first portion.

14. The method of claim 13, further comprising, between said groove forming step and said step of providing said third region, the step of forming an insulator on walls of said groove.

15. The method of claim 13, wherein said step of providing said third region comprises the step of introducing a dopant of said second conductivity type into a portion of said second region at the bottom of said groove.

16. The method of claim 13, further comprising the steps of:
   forming a second groove in said second region;
   providing a fourth semiconductor region of said second conductivity type adjacent a bottom of said second groove and contiguous with said third region;
   forming a third insulator on a surface of said second groove;
   forming a second conductor in said second groove;
   forming a third groove through said second conductor and through said third insulator to said fourth region; and
   forming a third conductor in said third groove.

17. The method of claim 16, wherein said third groove is substantially V-shaped.

18. The method of claim 16, wherein said second groove is contiguous with said first groove.

19. The method of claim 16, further comprising the steps of:
   prior to said steps of forming said first and second grooves, forming a fourth insulator on said second region;
   prior to said step of forming said third groove; forming a fifth insulator on said first and second conductors, a portion of said fifth insulator over said first conductor being thicker than said first insulator;
   forming a sixth insulator on a bottom of said third groove; and
   etching said fourth, fifth and sixth insulators until said fourth and sixth insulators are removed;
   and wherein said step of forming said third conductor comprises the step of forming a conductor on said second region.

20. The method of claim 13, further comprising the step of providing a fourth semiconductor region of said first conductivity type between said third region and said first groove, a dopant concentration of said fourth region being higher than a dopant concentration of said first portion of said second 21. The method of claim 20, further comprising the step of providing an electrical contact between said fourth region and said first conductor,
   wherein said conductor is a semiconductor region of said first conductivity type.

22. The method of claim 13, further comprising the steps of:
   forming a second groove in said second region;
   providing a fourth semiconductor region of said second conductivity type adjacent a bottom of said second groove and contiguous with said third region;
   providing a fifth semiconductor region of said first conductivity type between said third region and said first groove, a dopant concentration of said fifth region being higher than a dopant concentration of said first portion of said second region;
   providing a sixth semiconductor region of said first conductivity type between said fourth region and said second groove, a dopant concentration of said sixth region being higher than a dopant concentration of said first portion, said sixth region being contiguous with said fifth region;
   forming a third insulator on walls of said second groove; and
   forming a second conductor in said second groove in electrical contact with said sixth region, said second conductor being a semiconductor region of said first conductivity type.

23. The method of claim 22, wherein said second groove is contiguous with said first groove, and
   wherein said second conductor is contiguous with said first conductor.

24. The method of claim 22, wherein said step of forming said first insulator comprises the steps of:
   depositing a mask on a surface of said first and second grooves;
   removing said mask off the bottom of said first groove; and
   forming an insulator on the bottom of said first groove.

25. A method for making a transistor comprising the steps of:
   providing a first semiconductor region of a first conductivity type;
   providing a second semiconductor region of said first conductivity type on said first region, said second region having a first portion having a dopant concentration less than a dopant concentration of said first region;
   forming a first groove in said second region;
   extending said first groove to at least said first region;
   forming a first insulator on a bottom of said first groove;
   forming a second insulator on the bottom and sidewalls of said first groove; and
   forming a first conductor in said groove,
   wherein the step of forming the first insulator comprises the steps of:
   depositing a mask on a surface of said groove;
   etching said mask by a vertical etching process until at least a portion of said mask is removed from the bottom of said groove; and
   forming an insulator on the bottom of said groove.

26. A method for making a transistor comprising the steps of:
   providing a first semiconductor region of a first conductivity type;
   providing a second semiconductor region of said first conductivity type on said first region, said second region having a first portion having a dopant concentration less than a dopant concentration of said first region;
   forming a first groove in said second region;
   extending said first groove to at least said first region;
   forming a first insulator on a bottom of said first groove;
   forming a second insulator on the bottom and sidewalls of said first groove; and
   forming a first conductor in said groove, said method further comprising, prior to said groove forming step, the steps of:
   forming a third insulator on said second region; and
   forming a mask on said third insulator;
   and wherein said method further comprises the steps of:
   forming a fourth insulator thicker than said third insulator over said conductor;
   forming an opening through said fourth insulator to said gate;
   removing said mask;
   etching said third and fourth insulators until said third insulator is removed; and
   forming a conductor in said opening and on said second region.

27. A method for making a transistor comprising the steps of:
   providing a first semiconductor region of a first conductivity type;
   providing a second semiconductor region of said first conductivity type on said first region, said second region having a first portion having a dopant concentration less than a dopant concentration of said first region;
   forming a first groove in said second region;
   extending said first groove to at least said first region;
   forming a first insulator on a bottom of said first groove;
   forming a second insulator on the bottom and sidewalls of said first groove; and
   forming a first conductor in said groove,
   wherein said second region comprises a second portion having a dopant concentration higher than the dopant concentration of said first portion, and
   wherein said groove forming step comprises the steps of:
   forming a groove through said second portion;
   forming an insulator on walls of said groove through said second portion; and
   extending said groove.

* * * * *